US012700466B2

(12) United States Patent
Chang

(10) Patent No.: US 12,700,466 B2
(45) Date of Patent: Aug. 4, 2026

(54) ONE-TIME PROGRAMMABLE MEMORY DEVICES WITH HEATER DEVICES AND METHODS FOR MANUFACTURING AND OPERATING THE SAME

(71) Applicant: Taiwan Semiconductor Manufacturing Company, Ltd., Hsinchu (TW)

(72) Inventor: Meng-Sheng Chang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 176 days.

(21) Appl. No.: 18/483,745

(22) Filed: Oct. 10, 2023

(65) Prior Publication Data

US 2025/0118383 A1      Apr. 10, 2025

(51) Int. Cl.
*G11C 17/16* (2006.01)
*G11C 17/18* (2006.01)
*H10B 20/25* (2023.01)

(52) U.S. Cl.
CPC .............. *G11C 17/16* (2013.01); *G11C 17/18* (2013.01); *H10B 20/25* (2023.02)

(58) Field of Classification Search
CPC ................................. G11C 17/16; H10B 20/25

USPC .......................................................... 365/96
See application file for complete search history.

(56) References Cited

U.S. PATENT DOCUMENTS

| | | | |
|---|---|---|---|
| 8,987,079 B2 | 3/2015 | Or-Bach | |
| 2004/0100835 A1* | 5/2004 | Sugibayashi | G11C 11/16 |
| | | | 365/200 |
| 2014/0355336 A1* | 12/2014 | Hoya | G11C 11/1675 |
| | | | 365/158 |
| 2017/0264288 A1* | 9/2017 | Wu | H03K 17/102 |
| 2019/0228825 A1* | 7/2019 | Hecht | G11C 11/419 |
| 2019/0385656 A1* | 12/2019 | Lee | G11C 11/161 |

OTHER PUBLICATIONS

Office Action issued in connection with Taiwan Appl. No. 113101272 dated Nov. 4, 2024.

* cited by examiner

*Primary Examiner* — Muna A Techane
(74) *Attorney, Agent, or Firm* — Foley & Lardner LLP

(57) ABSTRACT

A semiconductor device includes a memory cell including a first transistor, a second transistor, and a resistor. Each of the first transistor and the second transistor is operatively coupled to the resistor in series. The second transistor is formed below the resistor such that the second transistor provides heat to the resistor when the memory cell is being programmed.

21 Claims, 15 Drawing Sheets

1102

Provide semiconductor substrate

1104

Form 1st transistors along frontside surface of the substrate

1106

Form frontside metallization layers over the 1st transistors

1108

Form 2nd transistors in one or more of the frontside metallization layers

1100

1200

1202

Provide efuse memory cell consisting of fuse resistor, access transistor and heater transistor

1204

Program the fuse resistor with the heater transistor heating the fuse resistor

GAA FET

1701F

1701

1704

1702

1706

1700

ONE-TIME PROGRAMMABLE MEMORY DEVICES WITH HEATER DEVICES AND METHODS FOR MANUFACTURING AND OPERATING THE SAME

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
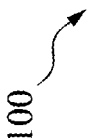
FIG. 1 illustrates a block diagram of an example semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As integrated circuit technology advances, integrated circuit features (e.g., the width of interconnect structures) have been decreasing, thereby allowing for more circuitry to be implemented in an integrated circuit. While implementing OTP memory devices such as, for example, a fuse, an electronic fuse (efuse), etc., in an integrated circuit, it may encounter various challenges. For example, with the decreasing width of interconnect structures, in general, respective dimensions of one or more fuse components of the OTP memory devices shrink accordingly. Given the continuously shrunk dimensions of the fuse components, it can become significantly challenging to program (e.g., burn down) the fuse components. Thus, the existing OTP memory devices have not been entirely satisfactory in many aspects.

The present disclosure provides various embodiments of an OTP memory device that includes a number of efuse memory cells, each of which includes or is operatively coupled to a heater device that may be implemented as any of various forms of transistors. For example, the efuse memory cells may each include a metal resistor (a fuse component), a first transistor, and a second transistor. The first and second transistors are each electrically connected to the metal resistor in series, and further, the second transistor is thermally coupled to the metal resistor. In various embodiments of the present disclosure, the first transistor may operatively serve as an access transistor for selectively allowing the memory cell (e.g., the metal resistor) to be programmed or read, and the second transistor may operatively serve as a heater transistor that can elevate a temperature of the metal resistor while being programmed. The metal resistor may be programmed once or a limited number of times. In one aspect of the present disclosure, the second transistor can be formed in a front-end-of-line (FEOL) network and include one or more bottom dielectric isolation (BDI) layers. Such BDI layers may block heat (e.g., generated from the second transistor) from being dissipated through a substrate. In another aspect of the present disclosure, the second transistor can be formed as a back-gate transistor embedded in a back-end-of-line (BEOL) network. Being embedded in the BEOL network (which typically formed of a number of dielectric layers), heat (e.g., generated from the second transistor) cannot be easily dissipated. As such, in either of the aspects, the second transistor can advantageously heat up the fuse component. Such "heated" fuse component may help to improve programming yield of the efuse memory cell, while keeping dimensions of the fuse component commensurate with the dimensions of various other device features in the advanced technology nodes.

FIG. 1 illustrates an example block diagram of a semiconductor (e.g., memory) device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being explicitly shown in FIG. 1, the components of the memory device 100 may be operatively coupled to each other and to the control logic circuit 112. For example, the control logic circuit 110, the I/O circuit 108, the column decoder 106, and the row decoder 104 may be electrically coupled to the memory array 102. Although, in the illustrated example of FIG. 1, the component are shown as separate blocks for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as a one-time-programmable (OTP) memory cell, e.g., an efuse memory cell that includes a fuse resistor, an access transistor, and a heater transistor, where each of the access transistor and the heater transistor is coupled to the fuse resistor in series. The access transistor and the heater transistor can be coupled to (e.g., gated by) the same word line (WL) or respectively different WLs. The access transistor and the heater transistor can be concurrently or respectively turned on/off to enable/disable an access (e.g., program, read) to the corresponding fuse resistor. For example, upon being selected, the access transistor and the heater transistor of the selected fuse cell can be concurrently turned on (e.g., through the same WL) to generate a program or read path conducting through its fuse resistor and itself. While being programmed, the heater transistor can generate heat for at least the fuse resistor by blocking heat from being dissipated. By placing the heater transistor substantially close to the fuse resistor, the heat accumulated can help to elevate a temperature of the fuse resistor. As such, programming efficiency of the memory cell 103 can be significantly improved. Detailed descriptions on the memory cell 103, configured as a efuse memory cell (sometimes referred to as efuse memory cell 103), will be discussed below with respect to FIG. 2.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
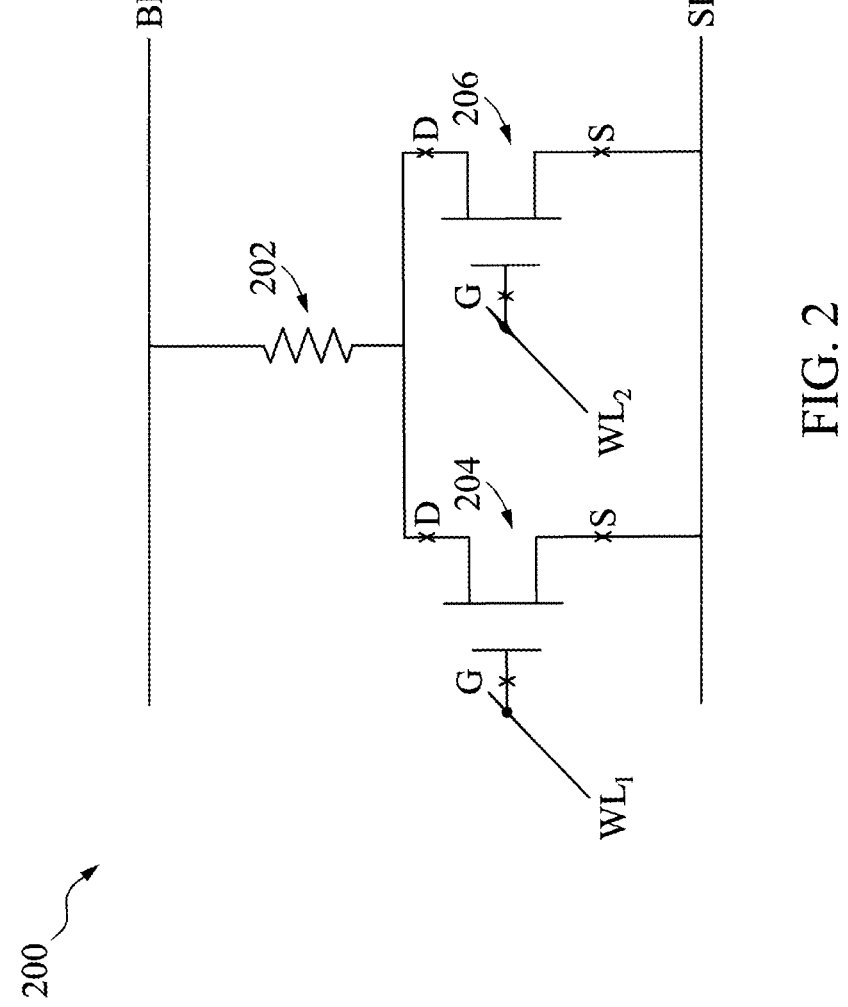
FIG. 2 illustrates an example schematic diagram of an efuse memory cell of the semiconductor device of FIG. 1 that includes one heater transistor, in accordance with some embodiments.

FIG. 2 illustrates an example configuration of an efuse memory cell 200 with improved programming efficiency through being heated up by a heater transistor included therein, in accordance with some embodiments. The efuse memory cell 200 may be one of the memory cells 103 of FIG. 1. In the example of FIG. 2, the efuse memory cell 200 is implemented as a two-transistor-one-resistor (2T1R) configuration, for example, a fuse resistor 202, an access transistor 204, and a heater transistor 206, in which each of the access transistor 204 and the heater transistor 206 is coupled to the fuse resistor 202 in series. Specifically, the access transistor 204 may have one of its source/drain terminals (e.g., a drain terminal in FIG. 2) and the heater transistor 206 may have one of its source/drain terminals (e.g., a drain terminal in FIG. 2) electrically coupled to the same terminal of the fuse resistor 202. It, however, should be understood that any of various other fuse configurations that exhibit the fuse characteristic may be used by the efuse memory cell 200 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 202, the access transistor 204, and the heater transistor 206 are formed on the same side of a substrate, e.g., the frontside of a semiconductor substrate. In one aspect of the present disclosure, the access transistor 204 and the heater transistor 206 are both formed along the frontside surface of a semiconductor substrate, which is sometimes referred to as part of a front-end-of-line (FEOL) network. Such a transistor is sometimes referred to as a FEOL transistor. Over the FEOL network, a number of metallization layers, each of which includes a number of conductive (e.g., metal) interconnect structures, are formed. Such metallization layers are sometimes referred to as part of a back-end-of-line (BEOL) network. The fuse resistor 202 may be formed as one or more of the metal structures in one of the metallization layers that are disposed above the access transistor 204 and the heater transistor 206. In another aspect of the present disclosure, the access transistor 204 may be formed in the FEOL network, while the heater transistor 206 and the fuse resistor 202 may be formed in the BEOL network. Such a transistor is sometimes referred to as a BEOL transistor. In yet another aspect of the present disclosure, the fuse resistor 202, the access transistor 204, and the heater transistor 206 may all be formed in the BEOL network.

With the fuse resistor 202 of the efuse memory cell 200 embodied as a metal structure, the fuse resistor 202 may present an initial resistance value (or resistivity), for example, as fabricated. To program the efuse memory cell 200, the access transistor 204 (if embodied as an n-type transistor) is turned on by applying a (e.g., voltage) signal, corresponding to a logic high state, through a first word line ($WL_1$) to a gate terminal of the access transistor 204. Concurrently or subsequently, a high enough (e.g., voltage/current) signal is applied on one of the terminals of the fuse resistor 202 through a bit line (BL). With the access transistor 204 turned on, a (e.g., programming) path can be provided from the BL, through the fuse resistor 202 and access transistor 204, and to a source line (SL).

Prior to, concurrently with, or subsequently to the programming path being formed, the heater transistor 206 (if embodied as another n-type transistor) can be turned on by applying a (e.g., voltage) signal, corresponding to a logic high state, through a second word line ($WL_2$) to a gate terminal of the heater transistor 206. The first word line $WL_1$ and the second word line $WL_2$ may be the same or different. In various embodiments of the present disclosure, the heater transistor 206 can include one or more of its components (e.g., a channel structure, source/drain structure) substantially close to or embedded in a dielectric layer, which can help to accumulate heat. Such heat can be provided to the thermally coupled fuse resistor 202 so as to elevate a temperature of at least a portion of the corresponding metal structure (of the fuse resistor 202). With the portion of the metal structure being heated up, the high voltage/current signal can more efficiently burn (or blow) out the metal structure (of the fuse resistor 202). Consequently, the fuse resistor 202 can transition from a first state (e.g., a short circuit) to a second state (e.g., an open circuit), which causes the efuse memory cell 200 to irreversibly transition from a first logic state (e.g., logic 0) to a second logic state (e.g., logic 1). The logic state can be read out by applying a relatively low voltage signal on the BL and turning on the access transistor 204 to provide a (e.g., reading) path.

FIGS. 3, 4, 5, and 6 illustrate respective cross-sectional views of semiconductor devices 300, 400, 500, and 600, each including one of the efuse memory cells 200 that each consist of a fuse resistor, an access transistor, and a heater transistor (e.g., corresponding to 202, 204, and 206 of FIG. 2, respectively), in accordance with some embodiments of the present disclosure. The cross-sectional views of FIGS. 3-6 are each cut along the lengthwise direction of channel structures of the access/heater transistor (e.g., the X direction). The access transistor and the heater transistor may each be implemented as a gate-all-around (GAA) field-effect-transistor (FET) device, in the illustrated embodiments of FIGS. 3-6. However, it should be understood that the access transistor and the heater transistor can be implemented as any of various other types of transistor structures, while remaining within the scope of the present disclosure. FIGS. 3-6 are simplified to illustrate relatively spatial configurations of the above-discussed components. Thus, it should be understood that the semiconductor devices 300-600 can each include one or more other features/structures, while remaining within the scope of the present disclosure.

Figure 3:
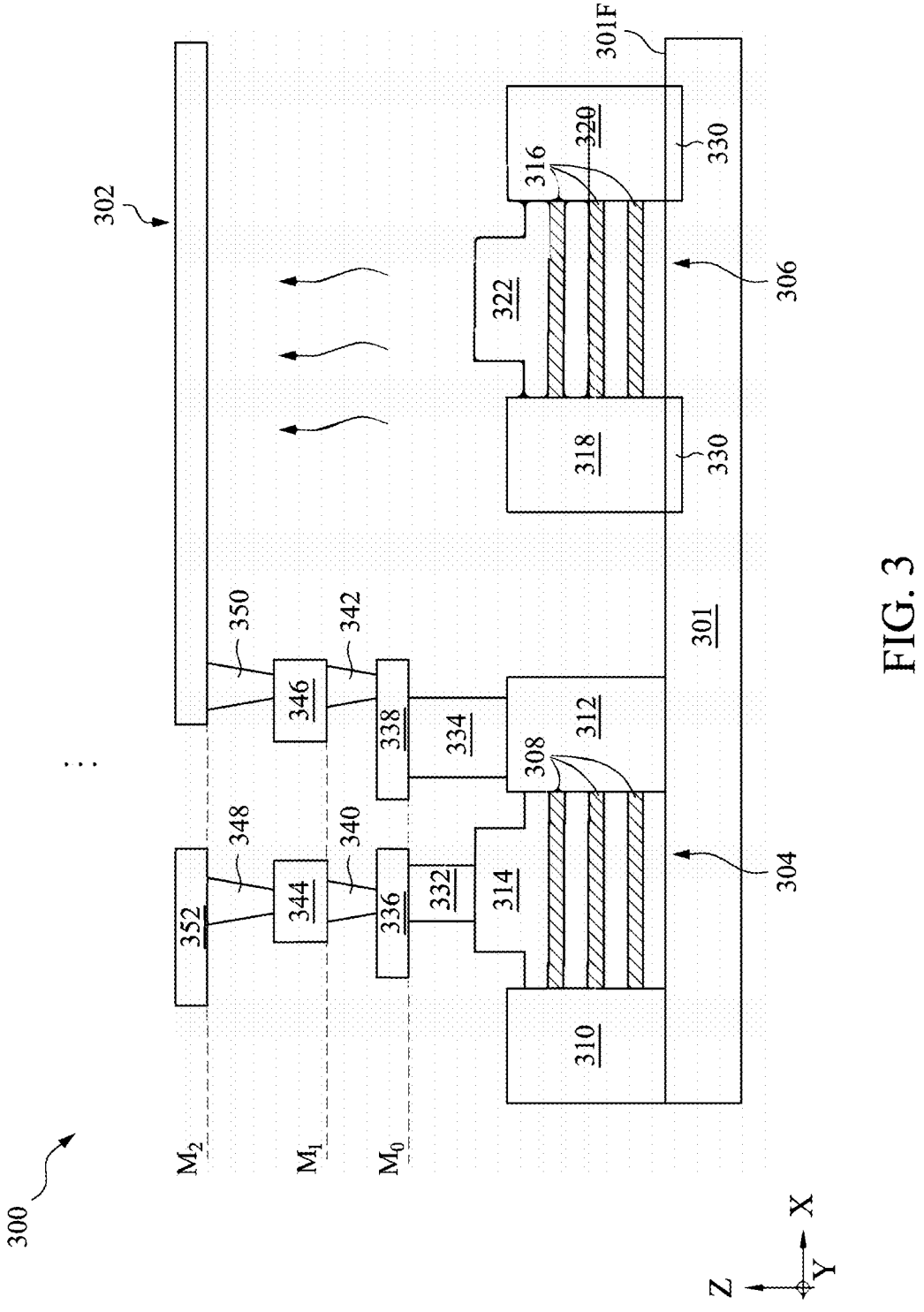
FIG. 3 illustrates a cross-sectional view of a semiconductor device including one of the efuse memory cells shown in FIG. 2, in accordance with some embodiments.

Referring first to FIG. 3, the semiconductor device 300 incudes a fuse resistor 302, an access transistor 304, and a heater transistor 306. In some embodiments, the fuse resistor 302, the access transistor 304, and the heater transistor 306 are formed on a first (e.g., front) side of a substrate 301. The substrate 301 may be implemented as a portion of a semiconductor (e.g., silicon) wafer. Further, the access transistor 304 and the heater transistor 306 are formed along a major surface 301F of the substrate 301, while the fuse resistor 302 is formed as one or more metal structures (e.g., metal lines) disposed in one of a plural number of metallization layers, e.g., M0, M1, M2, etc. Such metallization layers, each including a number of metal structures or metal lines embedded in an inter-layer dielectric (ILD) or inter-metal dielectric (IMD), are typically disposed over the major surface 301F of the substrate 301 on its frontside. Hereinafter, the access transistor 304 and the heater transistor 306 are referred to as being formed in a FEOL network, and the fuse resistor 302 is referred to as being formed in a BEOL network.

In the illustrated embodiment of FIG. 3, the access transistor 304 and the heater transistor 306 are each formed as a GAA FET. For example, the access transistor 304 includes a channel structure 308, source/drain structures 310-312, and an active (e.g., metal) gate structure 314; and the heater transistor 306 includes a channel structure 316, source/drain structures 318-320, and an active (e.g., metal) gate structure 322. The channel structures 308 and 316 each consist of one or more nanostructures (e.g., nanosheets, nanowires) vertically spaced apart from each other along the Z-direction. The metal gate structure 314 wraps around each of the nanostructures of the channel structure 308, with the source/drain structures 310 and 312 coupled to ends of the channel structure 308 along the X-direction; and the metal gate structure 322 wraps around each of the nanostructures of the channel structure 316, with the source/drain structures 318 and 320 coupled to ends of the channel structure 316 along the X-direction.

Further, the access transistor 304 may be directly formed over the substrate 301, while the heater transistor 306 may have one or more its components separated from the substrate 301 with respective dielectric layers, in accordance with some embodiments of the present disclosure. As shown, interposed between the substrate 301 and each of the source/drain structures 318 and 320, a dielectric layer 330 is present. In some embodiments, such a dielectric layer 330 may be a nitrided oxide or a hydrogenated oxide composite of silicon oxide. In some embodiments, the dielectric layer 330 may be formed of silicon germanium oxide ($SiGeO_x$) and/or germanium oxide ($GeO_x$). With the dielectric layer 330 formed between the source/drain structure 318/320 and the substate 301, heat generated when operating the semiconductor device 300 (e.g., the heater transistor 306) can be blocked from being dissipated through the substate 301 and thus be quickly accumulated. By placing the heater transistor 306 directly below the fuse resistor 302, the accumulated heat can advantageously propagate to the fuse resistor 302, which can elevate a temperature of the fuse resistor 302. As such, the fuse resistor 302 may be more efficiently programmed.

The semiconductor device 300 may further include a number of middle-end conductor (e.g., metal) structures, and each of the middle-end conductor structures can provide an electrical connection path for a corresponding gate structure or source/drain structure. For example, the semiconductor device 300 includes middle-end conductor structures 332 and 334. The middle-end conductor structure 332 is formed as a via structures and in electrical contact with the gate structure 314 (which is sometimes referred to as "VG"), and the middle-end conductor structure 334 is in electrical contact with the source/drain structure 312 (which is sometimes referred to as "MD").

Over the middle-end interconnect structures (e.g., VG, MD), the semiconductor device 300 may further include a number of frontside metallization layers, e.g., M0, M1, M2, etc. Each of the metallization layers includes a number of back-end conductor structures such as, for example, metal lines and via structures, embedded in a corresponding dielectric material (e.g., an IMD or ILD). The IMD/ILD may include one or more of a low-k dielectric layer (i.e., a dielectric with a dielectric constant less than about 3.9), an ultra low-k dielectric layer, or an oxide (e.g., silicon oxide).

For example in FIG. 3, the semiconductor device 300 includes frontside metallization layers, M0, M1, and M2. Although three frontside metallization layers are shown, it should be understood that the semiconductor device 300 can include any number of frontside metallization layers while remaining within the scope of the present disclosure. The metallization layer M0 includes metal lines 336 and 338 (which are sometimes referred to as "M0 tracks"), and via structures 340 and 342 (which are sometimes referred to as "V0"); the metallization layer M1 includes metal lines 344 and 346 (which are sometimes referred to as "M1 tracks"), and via structures 348 and 350 (which are sometimes referred to as "V1"); and the metallization layer M2 includes metal lines 352 and 302 (which are sometimes referred to as "M2 tracks"). Accordingly, in the illustrated example of FIG. 3, the fuse resistor 302 is one of the M2 tracks.

Figure 4:
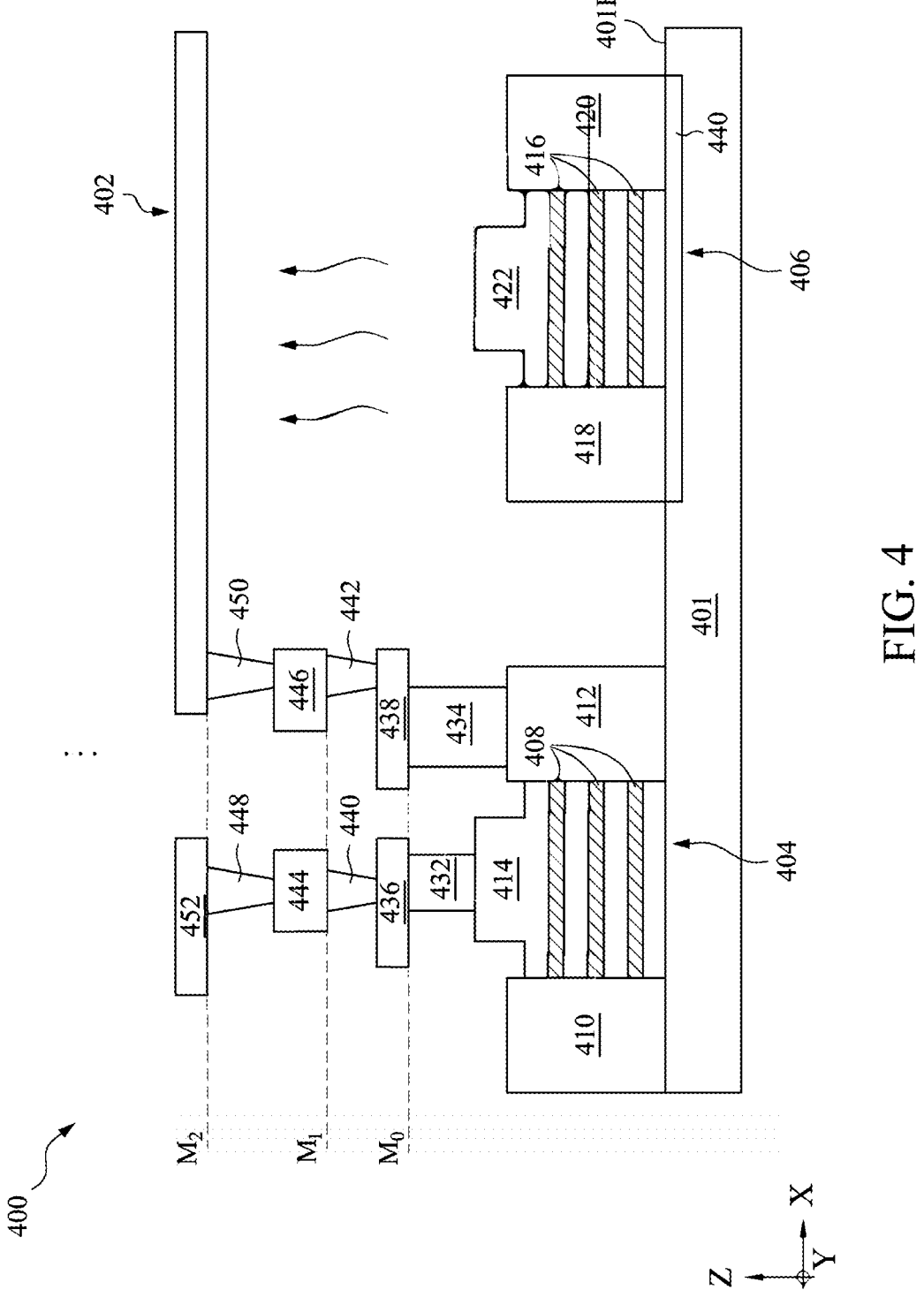
FIG. 4 illustrates a cross-sectional view of another semiconductor device including one of the efuse memory cells shown in FIG. 2, in accordance with some embodiments.

Referring next to FIG. 4, the semiconductor device 400 includes a fuse resistor 402, an access transistor 404, and a heater transistor 406. The semiconductor device 400 is substantially similar to the semiconductor device 300, except that each of the components of the heater transistor 406 is separated from a substrate with a corresponding dielectric layer 430. Stated another way, the heater transistor 406 is fully isolated from a substrate, in comparison with the heater transistor 306 that is partially isolated from a substrate. Hereinafter, the access transistor 404 and the heater transistor 406 are referred to as being formed in a FEOL network, and the fuse resistor 402 is referred to as being formed in a BEOL network.

As shown, the access transistor 404 and the heater transistor 406 are formed along a major surface 401F of a substrate 401, while the fuse resistor 402 is formed as one or more metal structures (e.g., metal lines) disposed in one of a plural number of metallization layers, e.g., M0, M1, M2, etc., disposed over the substrate 401. The access transistor 404 and the heater transistor 406 are each formed as a GAA FET. For example, the access transistor 404 includes a channel structure 408, source/drain structures 410-412, and an active (e.g., metal) gate structure 414; and the heater transistor 406 includes a channel structure 416, source/drain structures 418-420, and an active (e.g., metal) gate structure 422. The channel structures 408 and 416 each consist of one or more nanostructures (e.g., nanosheets, nanowires) vertically spaced apart from each other along the Z-direction. The metal gate structure 414 wraps around each of the nanostructures of the channel structure 408, with the source/drain structures 410 and 412 coupled to ends of the channel structure 408 along the X-direction; and the metal gate structure 422 wraps around each of the nanostructures of the channel structure 416, with the source/drain structures 418 and 420 coupled to ends of the channel structure 416 along the X-direction.

The access transistor 404 may be directly formed over the substrate 401, while the heater transistor 406 may have each of its components separated from the substrate 401 with a common dielectric layers, in accordance with some embodiments of the present disclosure. As shown, interposed between the substrate 401 and each of the source/drain structures 418 and 420 and the gate structure 422, a dielectric layer 430 is present. In some embodiments, such a dielectric layer 430 may be a nitrided oxide or a hydrogenated oxide composite of silicon oxide. In some embodiments, the dielectric layer 430 may be formed of silicon germanium oxide ($SiGeO_x$) and/or germanium oxide ($GeO_x$). With the dielectric layer 430 formed between each of the source/drain structure 418/420 and the gate structure 422 and the substate 401, heat generated when operating the semiconductor device 400 (e.g., the heater transistor 406) can be blocked from being dissipated through the substate 401 and thus be quickly accumulated. By placing the heater transistor 406 directly below the fuse resistor 402, the accumulated heat can advantageously propagate to the fuse resistor 402, which can elevate a temperature of the fuse resistor 402. As such, the fuse resistor 402 may be more efficiently programmed.

The semiconductor device 400 may further include a number of middle-end conductor (e.g., metal) structures, and each of the middle-end conductor structures can provide an electrical connection path for a corresponding gate structure or source/drain structure. For example, the semiconductor device 400 includes middle-end conductor structures 432 and 434. The middle-end conductor structure 432 is formed as a via structures and in electrical contact with the gate structure 414 (which is sometimes referred to as "VG"), and the middle-end conductor structure 434 is in electrical contact with the source/drain structure 412 (which is sometimes referred to as "MD").

Over the middle-end interconnect structures (e.g., VG, MD), the semiconductor device 400 may further include a number of frontside metallization layers, e.g., M0, M1, M2, etc. Each of the frontside metallization layers includes a number of back-end conductor structures such as, for example, metal lines and via structures, embedded in a corresponding dielectric material (e.g., an IMD or ILD). The IMD/ILD may include one or more of a low-k dielectric layer (i.e., a dielectric with a dielectric constant less than about 3.9), an ultra low-k dielectric layer, or an oxide (e.g., silicon oxide).

For example in FIG. 4, the semiconductor device 400 includes frontside metallization layers, M0, M1, and M2. Although three frontside metallization layers are shown, it should be understood that the semiconductor device 400 can include any number of frontside metallization layers while remaining within the scope of the present disclosure. The metallization layer M0 includes metal lines 436 and 438 (which are sometimes referred to as "M0 tracks"), and via structures 440 and 442 (which are sometimes referred to as "V0"); the metallization layer M1 includes metal lines 444 and 446 (which are sometimes referred to as "M1 tracks"), and via structures 448 and 450 (which are sometimes referred to as "V1"); and the metallization layer M2 includes metal lines 452 and 402 (which are sometimes referred to as "M2 tracks"). Accordingly, in the illustrated example of FIG. 4, the fuse resistor 402 is one of the M2 tracks.

Figure 5:
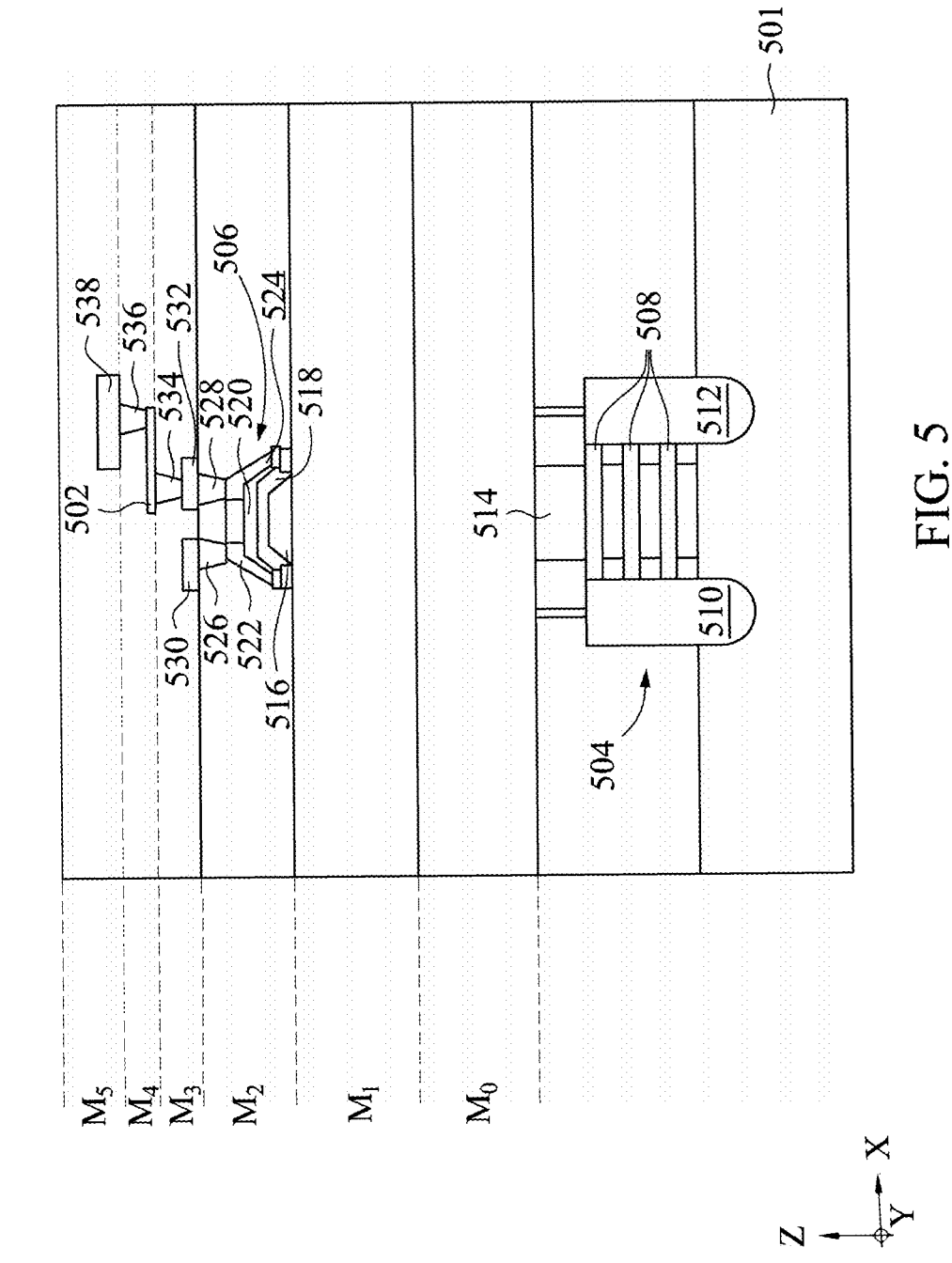
FIG. 5 illustrates a cross-sectional view of yet another semiconductor device including one of the efuse memory cells shown in FIG. 2, in accordance with some embodiments.

Referring next to FIG. 5, the semiconductor device 500 includes a fuse resistor 502, an access transistor 504, and a heater transistor 506. The semiconductor device 500 has one or more components similar to the semiconductor device 300. For example, the access transistor 504 may also be formed along a major surface of a substrate (i.e., in a FEOL network) and the fuse resistor 502 may also be formed in one of the metallization layers disposed above the substate (i.e., in a BEOL network). However, different from the heater transistor 306 of the semiconductor device 300, the heater transistor 506 may be formed in another one of the metallization layers (i.e., in the BEOL network). Hereinafter, the access transistor 504 is referred to as being formed in a FEOL network, and the fuse resistor 502 and the heater transistor 506 are referred to as being formed in a BEOL network.

As shown, the access transistor 504 is formed along a major surface 501F of a substrate 501, while the fuse resistor 502 is formed as one or more metal structures (e.g., metal lines) disposed in one of a plural number of metallization layers, e.g., M0, M1, M2, M3, M4, M5, etc., disposed over the substrate 501 and the heater transistor 506 is formed in another one of the metallization layers. For example, the fuse resistor 502 is formed in the metallization layer M4, and the heater transistor 506 is formed in the metallization layer M2. The access transistor 504 is formed as a GAA FET. For example, the access transistor 504 includes a channel structure 508, source/drain structures 510-512, and an active (e.g., metal) gate structure 514. The channel 508 consists of one or more nanostructures (e.g., nanosheets, nanowires) vertically spaced apart from each other along the Z-direction. The metal gate structure 514 wraps around each of the nanostructures of the channel structure 508, with the source/drain structures 510 and 512 coupled to ends of the channel structure 508 along the X-direction.

The heater transistor 506 may have each of its components embedded in one or more dielectric layers, in accordance with some embodiments of the present disclosure. As shown, the heater transistor 506 is formed as a two-dimensional back-gate transistor consisting of a bottom gate 516, a gate dielectric 518 disposed over the bottom gate 516, a channel structure 520 disposed over the gate dielectric 518, and a pair of source/drain structures 522 and 524 disposed over the channel structure 520. The term "two-dimensional back-gate transistor" may refer to a transistor having its gate formed as a relatively planar structure and its channel structure contacting a top surface of the gate. The bottom gate 516, gate dielectric 518, channel structure 520, and source/drain structures 522 and 524 are all disposed in the metallization layer M2. Further, the bottom gate 516, and the source/drain structures 522 and 524 may each be formed as a metal structure embedded in a ILD/IMD of the metallization layer M2.

With each of components of the heater transistor 506 embedded in the ILD/IMD and disposed away from the substrate 501, heat generated when operating the semiconductor device 500 (e.g., the heater transistor 506) can be blocked from being dissipated through the substate 501 and thus be quickly accumulated. By placing the heater transistor 506 directly below or substantially close to the fuse resistor 502, the accumulated heat can advantageously propagate to the fuse resistor 502, which can elevate a temperature of the fuse resistor 502. As such, the fuse resistor 502 may be more efficiently programmed.

To compatibly fabricate the heater transistor 506 in the BEOL network, the channel structure 520 may include one or more n-type semiconductive-behaving oxide materials or two-dimensional (2D) materials. In the case where the access transistor 504 is formed as an n-type GAA FET, the channel structure 520 may include one or more n-type semiconductive-behaving oxide materials such as, for example, IGZO, InZnO, InSnO, $SnO_2$, MgAlZnO, etc. In some other embodiments, the channel structure 520 may be formed of one or more n-type 2D materials such as, for example, transition metal dichalcogenide (TMD) material, graphene, etc. The 2D material generally refers to crystalline solids consisting of a single layer of atoms. The single layer of atoms can be derived from single elements or multiple elements. The 2D material may include a compound of transition metal atoms (Mo, W, Ti, or the like) and chalcogen atoms (S, Se, Te, or the like) such as, for example, $WS_2$, $WSe_2$, $WTe_2$, $MoS_2$, $MoSe_2$, MoTez, $HfS_2$, $ZrS_2$, and $TiS_2$, GaSe, InSe, phosphorene, and other similar materials.

In general, the access transistor 504 and the heater transistor 506 have the same conductive type (e.g., n-type), and thus, the channel structure 520 is formed of one or more n-type materials discussed above. However, it should be understood the channel structure 520 may be formed of one or more p-type materials (i.e., with the heater transistor 506 being p-type), in the case where the access transistor 504 is formed as a p-type GAA FET. As such, the channel structure 520 may include one or more p-type semiconductive-behaving oxide materials such as, for example, CuO, SnO, oxides of the Delafossite group Cu—X—O with or without doping, etc. In some other embodiments, the channel structure 520 may be formed of one or more p-type 2D materials such as, for example, transition metal dichalcogenide (TMD) material, graphene, etc.

Each of the frontside metallization layers, e.g., metallization layers M0 to M5, includes a number of back-end conductor structures such as, for example, metal lines and via structures, embedded in a corresponding dielectric material (e.g., an IMD or ILD). The IMD/ILD may include one or more of a low-k dielectric layer (i.e., a dielectric with a dielectric constant less than about 3.9), an ultra low-k dielectric layer, or an oxide (e.g., silicon oxide).

For example in FIG. 5, the semiconductor device 500 includes frontside metallization layers, M0, M1, M2, M3, M4, and M5. Although six frontside metallization layers are shown, it should be understood that the semiconductor device 500 can include any number of frontside metallization layers while remaining within the scope of the present disclosure. The metallization layer M2 may house the heater transistor 506, and further include via structures 526 and 528 (which are sometimes referred to as "V2"); the metallization layer M3 includes metal lines 530 and 532 (which are sometimes referred to as "M3 tracks"), and via structure 534 (which is sometimes referred to as "V3"); the metallization layer M4 includes metal line 502 (which is sometimes referred to as "M4 track") and via structure 536 (which is sometimes referred to as "V4"); and the metallization layer M5 includes metal line 538 (which is sometimes referred to as "M5 track"). Accordingly, in the illustrated example of FIG. 5, the fuse resistor 502 is one of the M4 tracks.

Figure 6:
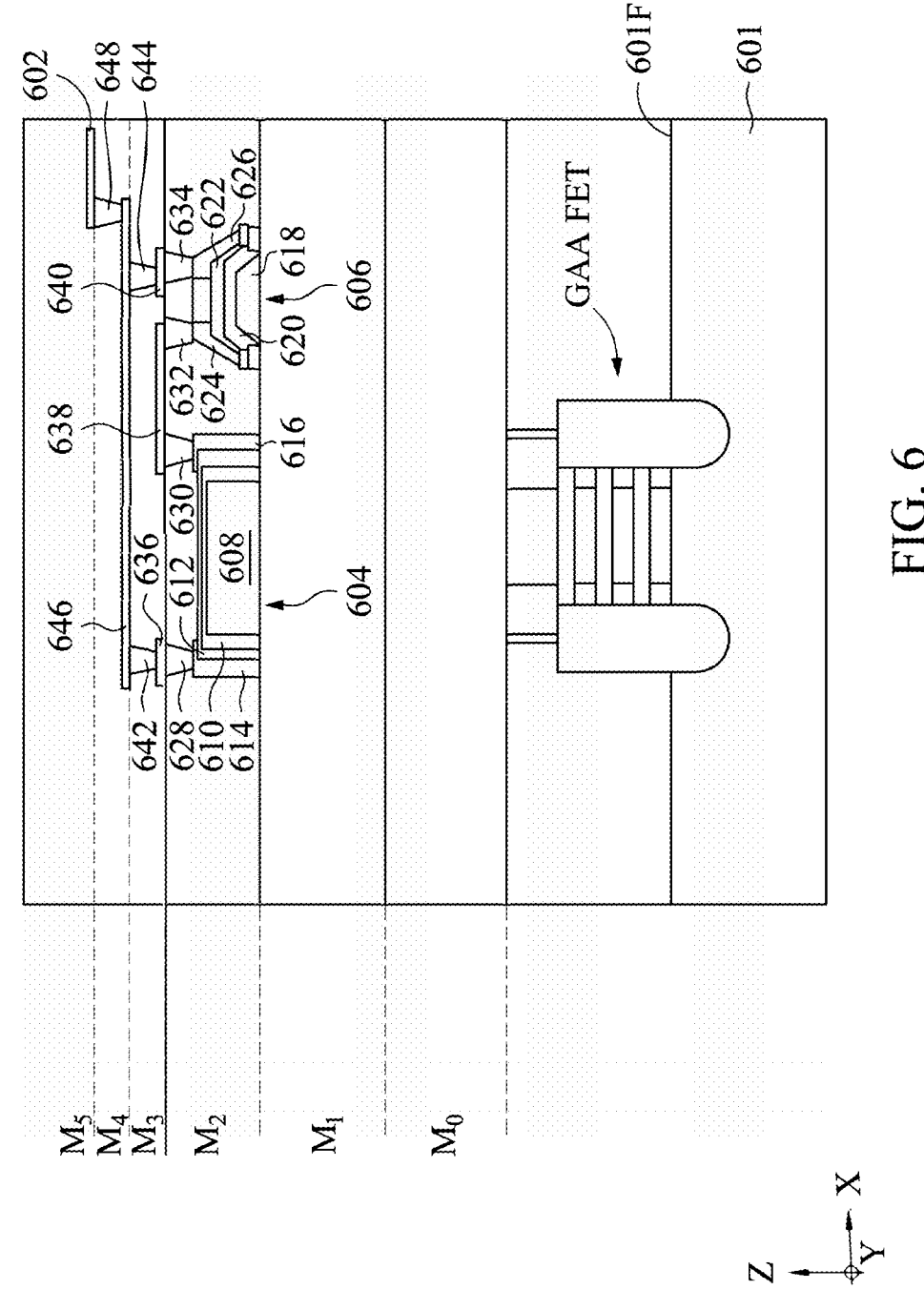
FIG. 6 illustrates a cross-sectional view of yet another semiconductor device including one of the efuse memory cells shown in FIG. 2, in accordance with some embodiments.

Referring then to FIG. 6, the semiconductor device 600 includes a fuse resistor 602, an access transistor 604, and a heater transistor 606. The semiconductor device 600 has one or more components similar to the semiconductor device 500. For example, the fuse resistor 602 and the heater transistor 606 may also be formed in a BEOL network. However, different from the access transistor 504 of the semiconductor device 500 that is formed in a FEOL network, the access transistor 604 may be formed in the same metallization layer as the heater transistor 606 (i.e., in the BEOL network). Hereinafter, the access transistor 604, the fuse resistor 602, and the heater transistor 606 are all referred to as being formed in a BEOL network.

As shown, along a major surface 601F of a substrate 601, one or more transistors (e.g., GAA FETs) can be formed that operatively serve as control circuits (e.g., driver circuits, control logic circuits, decoders, etc.) for memory cells of the semiconductor device 600, while the fuse resistor 602, the access transistor 604, and the heater transistor 606 are all formed in one or more of a plural number of metallization layers, e.g., M0, M1, M2, M3, M4, M5, etc., disposed over the substrate 501. For example, the fuse resistor 602 is formed in the metallization layer M5, and the access transistor 604 and heater transistor 606 are formed in the metallization layer M2.

The access transistor 604 may have each of its components embedded in one or more dielectric layers, in accordance with some embodiments of the present disclosure. As shown, the access transistor 604 is formed as three-dimensional back-gate transistor. The term "three-dimensional back-gate transistor" may refer to a transistor having its gate formed as a relatively protruding structure and its channel structure contacting multiple surfaces of the gate. For example, the access transistor 604 consists of a bottom gate 608, a gate dielectric 610 disposed over the bottom gate 608, a channel structure 612 disposed over the gate dielectric 610, and a pair of source/drain structures 614 and 616 disposed over the channel structure 612. The bottom gate 608, gate dielectric 610, channel structure 612, and source/drain structures 614 and 616 are all disposed in the metallization layer M2. Further, the bottom gate 608, and the source/drain structures 614 and 616 may each be formed as a metal structure embedded in a ILD/IMD of the metallization layer M2. In some embodiments, the bottom gate 608 may protrude from a surface of a dielectric layer, e.g., a bottom surface of the ILD/IMD of the metallization layer M2. The gate dielectric 610 and the channel structure 612 may be sequentially conformally formed over the bottom gate 608. As such, the bottom gate 608 can have at least three surfaces, e.g., its top surface and sidewalls, operatively (e.g., electrically) coupled to the channel structure 612.

The heater transistor 606 may have each of its components embedded in one or more dielectric layers, in accordance with some embodiments of the present disclosure. As shown, the heater transistor 606 is formed as a two-dimensional back-gate transistor consisting of a bottom gate 618, a gate dielectric 620 disposed over the bottom gate 618, a channel structure 622 disposed over the gate dielectric 620, and a pair of source/drain structures 624 and 626 disposed over the channel structure 622. The bottom gate 618, gate dielectric 620, channel structure 622, and source/drain structures 624 and 626 are all disposed in the metallization layer M2, e.g., the same metallization layer as the access transistor 604. However, it should be appreciated that the access transistor 604 and the heater transistor 606 may be disposed in respectively different metallization layers, while remaining within the scope of the present disclosure. Further, the bottom gate 618, and the source/drain structures 624 and 626 may each be formed as a metal structure embedded in the ILD/IMD of the metallization layer M2.

With each of components of the heater transistor 606 embedded in the ILD/IMD and disposed away from the substrate 601, heat generated when operating the semiconductor device 600 (e.g., the heater transistor 606) can be blocked from being dissipated through the substate 5601 and thus be quickly accumulated. By placing the heater transistor 606 directly below or substantially close to the fuse resistor 602, the accumulated heat can advantageously propagate to the fuse resistor 602, which can elevate a temperature of the fuse resistor 602. As such, the fuse resistor 602 may be more efficiently programmed.

To compatibly fabricate the access transistor 604 and heater transistor 606 in the BEOL network, the channel structure 612/622 may include one or more n-type semiconductive-behaving oxide materials or two-dimensional (2D) materials. In the case where the access transistor 604 is formed as an n-type transistor, the channel structure 612/622 may include one or more n-type semiconductive-behaving oxide materials such as, for example, IGZO, InZnO, InSnO, $SnO_2$, MgAlZnO, etc. In some other embodiments, the channel structure 612/622 may be formed of one or more n-type 2D materials such as, for example, transition metal dichalcogenide (TMD) material, graphene, etc. The 2D material generally refers to crystalline solids consisting of a single layer of atoms. The single layer of atoms can be derived from single elements or multiple elements. The 2D material may include a compound of transition metal atoms (Mo, W, Ti, or the like) and chalcogen atoms (S, Se, Te, or the like) such as, for example, WS2, WSe2, WTe2, $MoS_2$, MoSez, MoTez, $HfS_2$, $ZrS_2$, and $TiS_2$, GaSe, InSe, phosphorene, and other similar materials.

However, it should be understood the channel structure 612/622 may be formed of one or more p-type materials. As such, the channel structure 612/622 may include one or more p-type semiconductive-behaving oxide materials such as, for example, CuO, SnO, oxides of the Delafossite group Cu—X—O with or without doping, etc. In some other embodiments, the channel structure 612/622 may be formed of one or more p-type 2D materials such as, for example, transition metal dichalcogenide (TMD) material, graphene, etc.

Each of the frontside metallization layers, e.g., metallization layers M0 to M5, includes a number of back-end conductor structures such as, for example, metal lines and via structures, embedded in a corresponding dielectric material (e.g., an IMD or ILD). The IMD/ILD may include one or more of a low-k dielectric layer (i.e., a dielectric with a dielectric constant less than about 3.9), an ultra low-k dielectric layer, or an oxide (e.g., silicon oxide).

For example in FIG. 6, the semiconductor device 600 includes frontside metallization layers, M0, M1, M2, M3, M4, and M5. Although six frontside metallization layers are shown, it should be understood that the semiconductor device 600 can include any number of frontside metallization layers while remaining within the scope of the present disclosure. The metallization layer M2 may house both of the access transistor 604 and the heater transistor 606, and further include via structures 628, 630, 632, and 634 (which are sometimes referred to as "V2s"); the metallization layer M3 includes metal lines 636, 638, and 640 (which are sometimes referred to as "M3 tracks"), and via structures 642 and 644 (which are sometimes referred to as "V3s"); the metallization layer M4 includes metal line 646 (which is sometimes referred to as "M4 track") and via structure 648 (which is sometimes referred to as "V4"); and the metallization layer M5 includes metal line 602 (which is sometimes referred to as "M5 track"). Accordingly, in the illustrated example of FIG. 6, the fuse resistor 602 is one of the M5 tracks.

Figure 7:
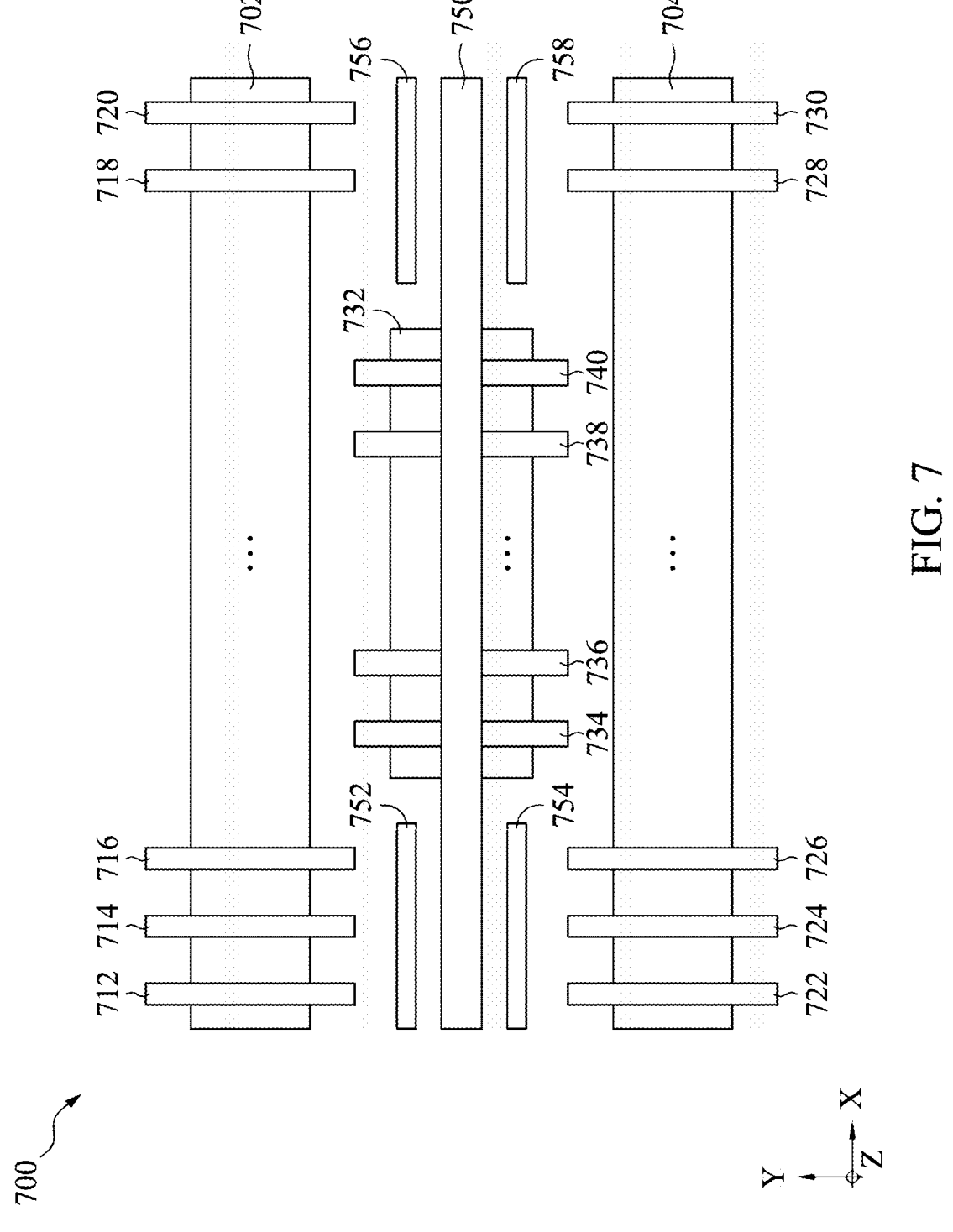
FIG. 7 illustrates an example layout view of the efuse memory cells shown in FIG. 2, in accordance with some embodiments.

FIG. 7 illustrates an example layout view or top view configured to form the disclosed efuse memory cell (e.g., 300 of FIG. 3, 400 of FIG. 4), in accordance with various embodiments. The efuse memory cell, as disclosed herein, is formed of an access transistor, a heater transistor, and a fuse resistor, in which each of the access transistor and the heater transistor is connected to the fuse resistor in series. Further, the heater transistor may be disposed directly below the fuse resistor to efficiently propagate accumulated heat to the fuse resistor. In some embodiments, the access transistor can be constructed by a number (e.g., about 100) of sub-transistors, be coupled to one another in parallel. The heater transistor can also be constructed by a number of sub-transistor, coupled to one another in parallel. The fuse resistor can be constructed by at least a frontside metal structure disposed over those sub-transistors.

As shown, the layout 700 includes patterns 702 and 704 that are each configured to form an active region (hereinafter "active region 702," and "active region 704," respectively); and patterns 712, 714, 716, 718, 720, 722, 724, 726, 728, and 730 that are each configured to form a gate structure (hereinafter "gate structure 712," "gate structure 714," "gate structure 716," "gate structure 718," "gate structure 720," "gate structure 722," "gate structure 724," "gate structure 726," "gate structure 728," and "gate structure 730," respectively). It should be understood that the layout 700 can include any number of the active regions and gate structures, while remaining within the scope of present disclosure.

The active regions 702 to 704 may extend along a first lateral direction (e.g., X-direction), while the gate structures 712 to 730 may extend along a second, different lateral direction (e.g., Y-direction). Further, the gate structures 712 to 720 can each traverse the active region 702, and the gate structures 722 to 730 can each traverse the active region 704. In various embodiments, each of the active regions 702 to 704 is formed of a stack structure protruding from the frontside surface of a substrate. The stack includes a number of semiconductor nanostructures (e.g., nanosheets) extending along the X-direction and vertically separated from each other. Portions of the semiconductor structures in the stack that are overlaid by the gate structure remain, while other portions are replaced with a number of epitaxial structures. The remaining portions of the semiconductor structures can be configured as the channel of a corresponding transistor (or sub-transistor), the epitaxial structures coupled to both sides (or ends) of the remaining portions of the semiconductor structures can be configured as source/drain structures (or terminals) of the transistor (or sub-transistor), and a portion of the gate structure that overlays (e.g., straddles) the remaining portions of the semiconductor structures can be configured as a gate structures (or terminal) of the transistor (or sub-transistor).

For example in FIG. 7, the portion of the active region 702 that is overlaid by the gate structure 712 may include a number of nanostructures vertically separated from each other, which can function as the channel of a sub-transistor. The portions of the active region 702 that are disposed on opposite sides of the gate structure portion 712 are replaced with epitaxial structures. Such epitaxial structures can function as source/drain terminals ("D" and "S" of FIG. 2) of the sub-transistor. The gate structure 712 can function as a gate terminal ("G" of FIG. 2) of sub-transistor. Thus, it should be appreciated that the layout 700 can be used to fabricate a certain number of such sub-transistors. In some embodiments, such sub-transistors, formed based on the patterns 702-704 and 712-730, can be electrically coupled to each other in parallel to collectively function as the access transistor of an efuse memory cell (e.g., 304 of FIG. 3).

The layout 700 further includes patterns 732, 734, 736, 738, and 740, in which the pattern 732 is configured to form an active region (hereinafter "active region 732") and the patterns 734 to 740, traversing the active region 732, are configured to form gate structures (hereinafter "gate structure 734," "gate structure 736," "gate structure 738," and "gate structure 740," respectively). Similar to the active regions 702-704 and the gate structures 712-730, the active region 732 and the gate structures 734-740 can collectively function as a transistor, e.g., the heater transistor of an efuse memory cell (e.g., 306 of FIG. 3), and thus, the description is not repeated.

The layout 700 further includes patterns 750, 752, 44754, 754, 756, and 758 that are each configured to form a metal structure (hereinafter "metal structure 750," "metal structure 752," "metal structure 754," "metal structure 756," and "metal structure 758," respectively). The metal structures 750 to 758 may extend along the first lateral direction (e.g., X-direction), with the metal structure 750 being the longest one to have a length about the same as a length of the active regions 702-704 (along the X-direction) and with the rest of metal structures 752 to 758 being shorter and offset from the metal structure 750 along the Y-direction. The metal structures 750 to 758 may each be formed as a metal line disposed in an M2 metallization layer (FIG. 3), e.g., an M2 track. The metal structure 750 can function as the fuse resistor of the efuse memory cell (e.g., 302 of FIG. 3). In some embodiments, the active region 732 is disposed directly below the metal structure 750, which makes the heater transistor (e.g., 306 of FIG. 3) disposed directly below the fuse resistor (e.g., 302 of FIG. 3). As a result, a temperate of the fuse resistor can be efficiently elevated by the heater transistor.

Figure 9:
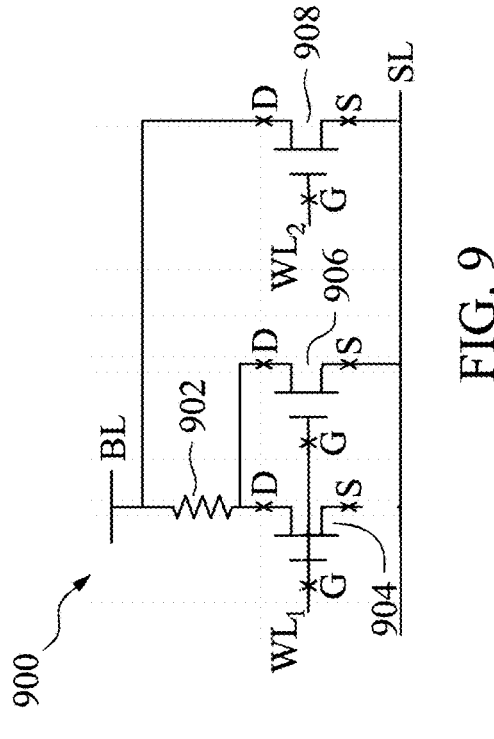
FIGS. 8, 9, and 10 illustrate other example schematic diagrams of an efuse memory cell of the semiconductor device of FIG. 1 that includes at least one heater transistor, in accordance with some embodiments.
Figure 10:
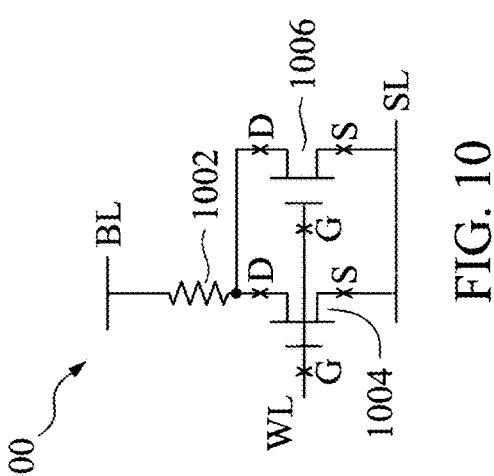
Figure 8:
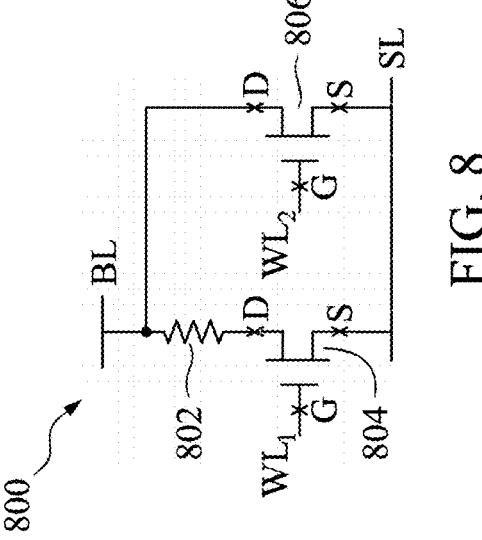

Other than the efuse memory cell 200 discussed with respect to FIG. 2, the present disclosure provide various other configurations of an efuse memory cell that can be efficiently programmed through one or more heater transistors. FIGS. 8, 9, and 10 illustrate configurations of efuse memory cells 800, 900, and 1000, respectively, in accordance with some embodiments of the present disclosure.

In FIG. 8, the efuse memory cell 800 includes a fuse resistor 802, an access transistor 804, and a heater transistor 806. The efuse memory cell 800 is similar to the efuse memory cell 200 (FIG. 2). However, different from the configuration shown in FIG. 2, the access transistor 804 may have one of its source/drain terminals (e.g., a drain terminal in FIG. 8) electrically coupled to one of the terminals of the fuse resistor 802, and the heater transistor 806 may have one of its source/drain terminals (e.g., a drain terminal in FIG. 8) electrically coupled to the other terminal of the fuse resistor 802. In some embodiments, both of the access transistor 804 and the heater transistor 806 may be formed in the FEOL network as any of various transistor structures (e.g., GAA FETs), while the fuss resistor 802 may be formed in the BEOL network. Further, the heater transistor 806 may have at least one of its components isolated from a corresponding semiconductor substrate through a dielectric layer.

In FIG. 9, the efuse memory cell 900 includes a fuse resistor 902, an access transistor 904, a first heater transistor 906, and a second heater transistor 908. The efuse memory cell 900 is similar to the efuse memory cell 200 (FIG. 2). However, different from the configuration shown in FIG. 2, the efuse memory cell 900 includes an additional heater transistor 908. The first heater transistor 906 have one of its source/drain terminals (e.g., a drain terminal in FIG. 9) electrically coupled to one of the terminals of the fuse resistor 902, and the second heater transistor 908 may have one of its source/drain terminals (e.g., a drain terminal in FIG. 9) electrically coupled to the other terminal of the fuse resistor 902. In some embodiments, all of the access transistor 904, the first heater transistor 906, and the second heater transistor 908 may be formed in the FEOL network as any of various transistor structures (e.g., GAA FETs), while the fuss resistor 902 may be formed in the BEOL network. Further, the first and second heater transistors 906 and 908 may each have at least one of its components isolated from a corresponding semiconductor substrate through a dielectric layer.

In FIG. 10, the efuse memory cell 1000 includes a fuse resistor 1002, an access transistor 1004, and a heater transistor 1006. The efuse memory cell 1000 is similar to the efuse memory cell 200 (FIG. 2). However, different from the configuration shown in FIG. 2, the access transistor 1004 and the heater transistor 1006 may have their gate terminals controlled by the same word line (WL). In some embodiments, both of the access transistor 1004 and the heater transistor 1006 may be formed in the FEOL network as any of various transistor structures (e.g., GAA FETs), while the fuss resistor 1002 may be formed in the BEOL network. Further, in one aspect, the heater transistor 1006 may have at least one of its components isolated from a corresponding semiconductor substrate through a dielectric layer. In another aspect, the access transistor 1004 and the heater transistor 1006 may each have at least one of its components isolated from a corresponding semiconductor substrate through a dielectric layer.

Figure 11:
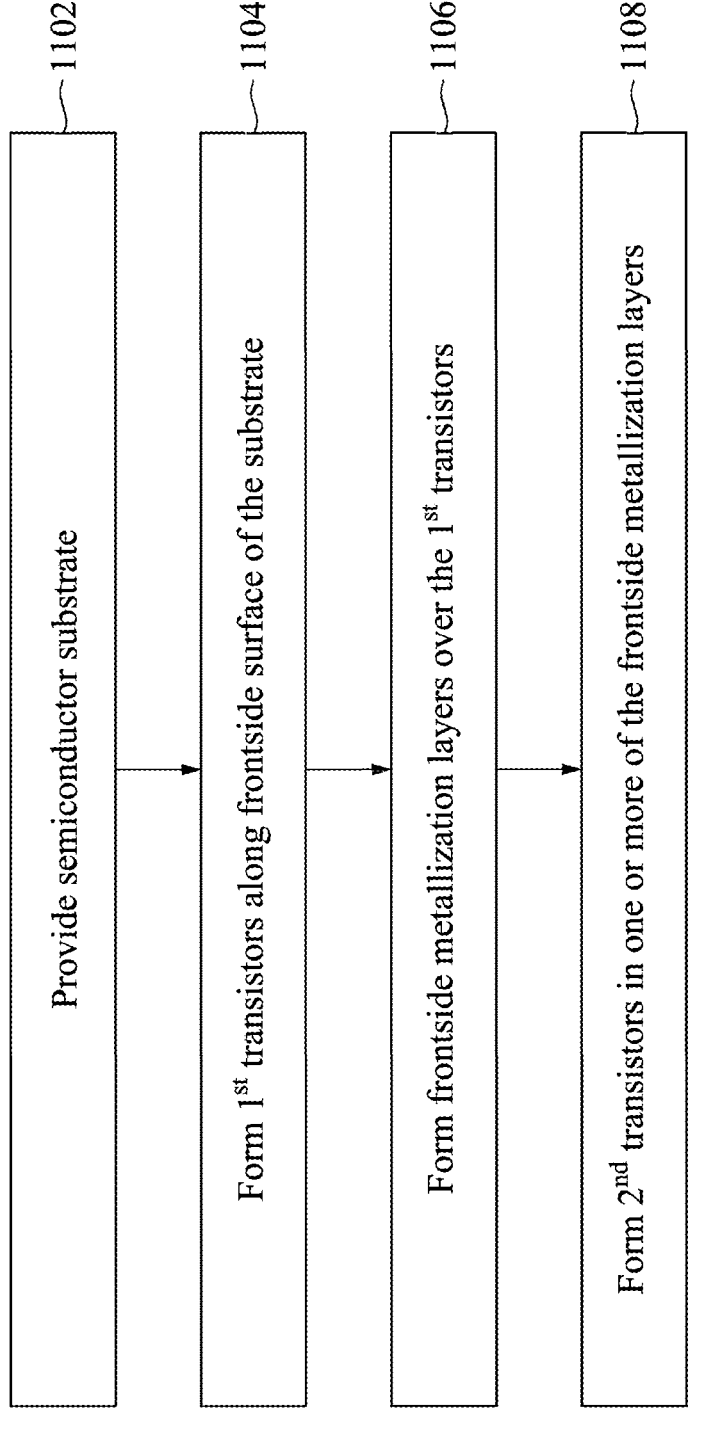
FIG. 11 is an example flow chart of a method for fabricating a semiconductor device that includes a number of the disclosed efuse memory cells, in accordance with some embodiments.

FIG. 11 is a flowchart illustrating an example method 1100 for fabricating a semiconductor device that includes the disclosed efuse memory cell (e.g., 300 of FIG. 3, 400 of FIG. 4, 500 of FIG. 5, 600 of FIG. 6) with a fuse resistor, an access transistor, and at least one heater transistor, according to various aspects of the present disclosure. In one aspect, some operations of the method 1100 can be used to fabricate at least one of the access transistor or the heater transistor as a transistor in a FEOL network. In another aspect, some operations of the method 1100 can be used to fabricate at least one of the access transistor or the heater transistor as a transistor in a BEOL network. It should be noted that the method 1100 is merely an example, and is not intended to limit the present disclosure. Accordingly, it should be understood that additional operations may be provided before, during, and/or after the method 1100, and that some other operations may only be briefly described herein. The following discussions of the method 1100 may refer to one or more components discussed with respect to FIGS. 1-6.

In brief overview, the method 1100 starts with operation 1102 of providing a semiconductor substrate. The method 1100 proceeds to operation 1104 of forming a number of first transistors along a frontside surface of the semiconductor substrate. The method 1100 proceeds to operation 1106 of forming a number of frontside metallization layers over the first transistors. The method 1100 optionally proceeds to operation 1108 of forming a number of second transistors in one or more of the frontside metallization layers.

The first transistors and interconnect structures of the frontside metallization layers may form a number of disclosed efuse memory cells (e.g., an array of the efuse memory cells. In one aspect of the present disclosure, each of the efuse memory cells can include an access transistor, a heater transistor, and a fuse resistor, in which the access transistor (e.g., 304, 404) and heater transistor (e.g., 306,

406) are implemented as respective ones of the first transistors while the fuse resistor (e.g., 302, 402) is implemented as an interconnect structure disposed in one of the metallization layers. In another aspect of the present disclosure, each of the efuse memory cells can include an access transistor, a heater transistor, and a fuse resistor, in which the access transistor (e.g., 504) is implanted as one of the first transistors while the fuse resistor (e.g., 502) is implemented as an interconnect structure disposed in one of the metallization layers and the heater transistor (e.g., 506) is implemented as one of the second transistors. In yet another aspect of the present disclosure, each of the efuse memory cells can include an access transistor, a heater transistor, and a fuse resistor, in which the fuse resistor (e.g., 602) is implemented as an interconnect structure disposed in one of the metallization layers, and the access transistor (e.g., 604) and heater transistor (e.g., 606) are implemented as respective ones of the second transistors.

Referring first to operation 1102, the semiconductor substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Referring next to operation 1104, along the frontside surface of the semiconductor substrate, a number of first transistors are formed. Such first transistors formed along the surface of the substrate are sometimes referred to as FEOL transistors. In one example embodiment of the present disclosure, the first transistor may be implemented as a GAA transistor structure. The GAA transistor may be formed by at least some of the following process steps: forming a fin structure protruding from the substrate, wherein the fin structure includes a number of first semiconductor nanostructures and a number of second semiconductor nanostructures alternately stacked on top of one another; forming a dummy gate structure straddling the fin structure; forming gate spacers disposed along opposite sidewalls of the dummy gate structure; recessing portions of the fin structure that are not overlaid by the dummy gate structure (and the gate spacer); replacing respective end portions of each second semiconductor nanostructures with a dielectric material to form a number of inner spacers; forming source/drain structures in the fin structure that are disposed on opposite sides of the dummy gate structure; removing the dummy gate structure; removing the remaining second semiconductor nanostructures; and forming an active (e.g., metal) gate structure to wrap around each of the first semiconductor nanostructures. In some embodiments, the first semiconductor nanostructures may be collectively referred to as a channel of the GAA transistor, and the second semiconductor nanostructures being replaced with the active gate structure may be referred to as sacrificial nanostructures.

In the example where some of the first transistors are operatively configured as heater transistors (e.g., 306, 406), prior to forming the first transistors, one or more dielectric layers may be formed along the frontside surface of the semiconductor substrate, or buried in the semiconductor substrate. Such dielectric layers may be formed by oxidizing the frontside surface of the semiconductor substrate, performing an epitaxial growth from the semiconductor substrate, or performing a deposition process. In one aspect of the present disclosure, locations of such dielectric layers (e.g., 330) may correspond to source/drain structures of the heater transistors, respectively. In another aspect of the present disclosure, locations of the dielectric layers (e.g., 430) may correspond to the heater transistors, respectively.

Referring next to operation 1106, over the first transistors, a number of the frontside metallization layers, each of which includes a number of interconnect structures embedded in an IMD/ILD, are formed. The interconnect structures can include a number of middle-end-of-line (MEOL) interconnect structures (e.g., MDs, VDs, VGs), and a number of back-end-of-line (BEOL) interconnect structures (e.g., M0 tracks, V0s, M1 tracks, etc.), as described above. Each of the interconnect structures can include one or more metal materials such as, for example, tungsten (W), copper (Cu), gold (Au), cobalt (Co), ruthenium (Ru), or combinations thereof. The IMD/ILD, embedding the interconnect structure, can include one or more of a low-k dielectric layer (i.e., a dielectric with a dielectric constant less than about 3.9), an ultra low-k dielectric layer, or an oxide (e.g., silicon oxide).

Referring next to optional operation 1108, a number of second transistors can be formed in one or more of the frontside metallization layers. Such second transistors formed in one or more frontside metallization layers are sometimes referred to as BEOL transistors. Some of the second transistors can be implemented as two-dimensional back-gate transistors (e.g., 506, 606), which can operatively serve as the heater transistors. Some of the second transistors can be implemented as three-dimensional back-gate transistors (e.g., 604), which can operatively serve as the access transistors. Each of such BEOL transistors can have its channel structure formed of one or more semiconductive-behaving oxide materials such as, for example, IGZO, InZnO, InSnO, $SnO_2$, MgAlZnO, etc., or one or more 2D materials such as, for example, transition metal dichalcogenide (TMD) material, graphene, etc.

Figure 12:
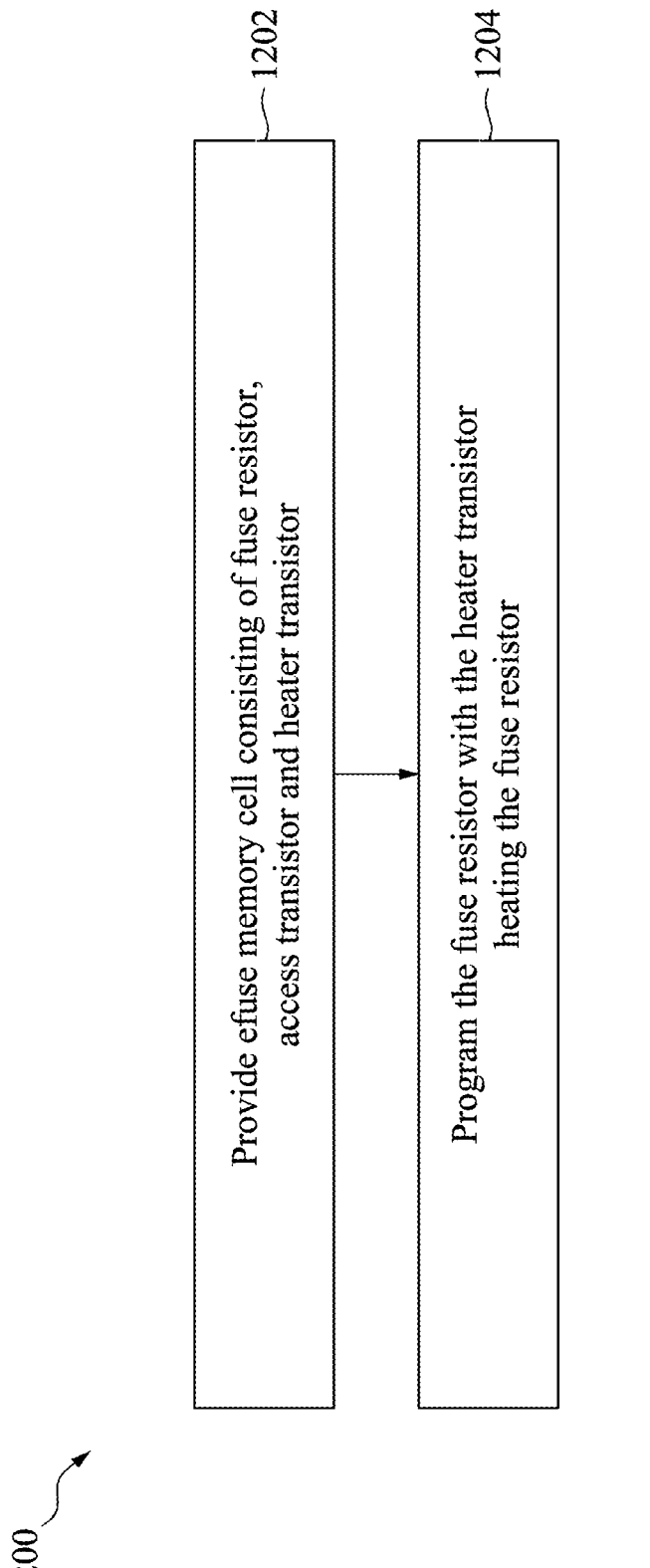
FIG. 12 is an example flow chart of a method for operating a semiconductor device that includes a number of the disclosed efuse memory cells, in accordance with some embodiments.

FIG. 12 is a flowchart illustrating an example method 1200 for operating the disclosed efuse memory cell (e.g., 300 of FIG. 3, 400 of FIG. 4, 500 of FIG. 5, 600 of FIG. 6), each of which consists of a fuse resistor, an access transistor, and at least one heater transistor, according to various aspects of the present disclosure. It should be noted that the method 1200 is merely an example, and is not intended to limit the present disclosure. Accordingly, it should be understood that additional operations may be provided before, during, and/or after the method 1200, and that some other operations may only be briefly described herein.

The method 1200 starts with operation 1202 in which an efuse memory cell is provided. The efuse memory cell may consist of a fuse resistor, an access transistor, and at least one heater transistor. In various embodiments, the operation 1202 may include some or all of the operations of the method 1100 (FIG. 11). For example, the efuse memory cell (e.g., 300, 400) may have its fuse resistor formed in the BEOL network, while having its access transistor and heater transistor formed in the FEOL network. In another example, the efuse memory cell (e.g., 500) may have its fuse resistor formed in the BEOL network, while having its access transistor and heater transistor formed in the FEOL network and the BEOL network, respectively. In yet another example, the efuse memory cell (e.g., 600) may have its fuse resistor, access transistor, and heater transistor all formed in the BEOL network.

The method 1200 proceeds to operation 1204 in which the fuse resistor is programmed, with the heater transistor heating the fuse resistor. Based on the different configurations of the efuse memory cell, a temperature of the fuse resistor can be elevated through propagating heat to the fuse resistor, that is accumulated by the heater transistor. As such, programming yield of the efuse memory cell can be advantageously improved. In the example of FIGS. 3-4, the heat may be accumulated by the heater transistors 306 and 406 that are formed in the FEOL network. In the example of FIGS. 5-6, the heat may be accumulated by the heater transistors 506 and 606 that are formed in the BEOL network.

Figure 13:
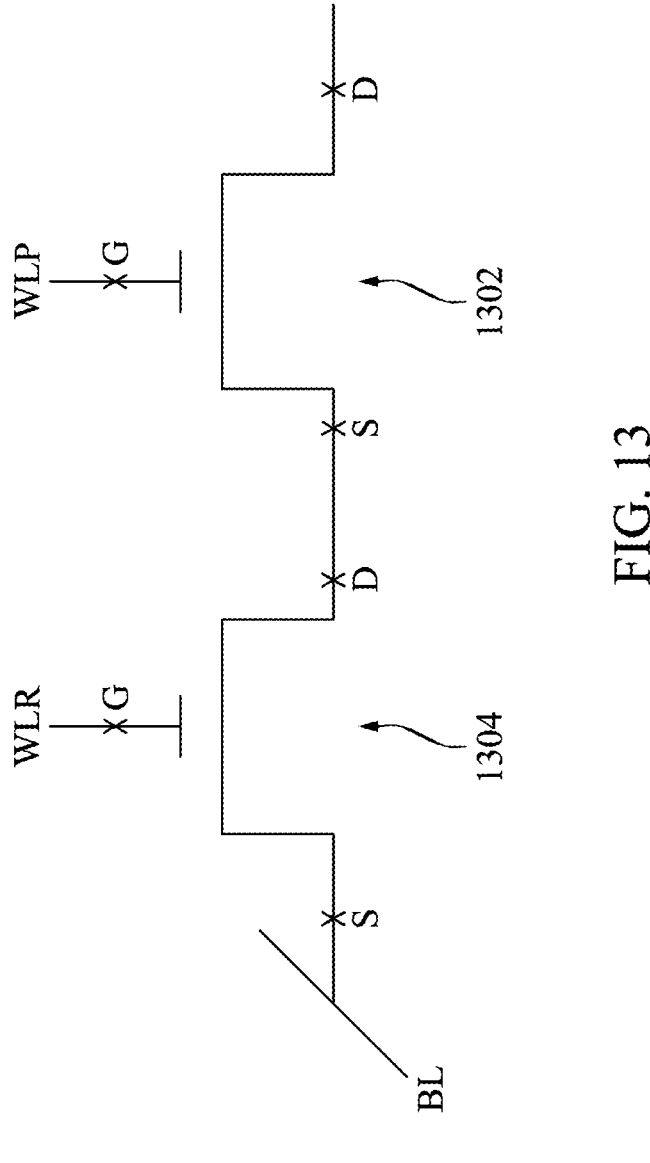
FIG. 13 illustrates an example schematic diagram of an anti-fuse memory cell of the semiconductor device of FIG. 1, in accordance with some embodiments.

FIG. 13 illustrates an example configuration of an anti-fuse memory cell 1300 that may include each of its components formed in the BEOL network, in accordance with some embodiments. The anti-fuse memory cell 1300 may be one of the memory cells 103 of FIG. 1. The anti-fuse memory cell 1300 may be another form of the OTP memory devices.

In the example of FIG. 13, the anti-fuse memory cell 1300 includes a programming transistor 1302 and a reading transistor 1304. The programming transistor 1302 and the reading transistor 1304 are electrically coupled to each other in series. Further, one of the source/drain terminals of the programming transistor 1302 is floating (e.g., coupled to nothing), with the other source/drain terminal connected to one of the source/drain terminals of the reading transistor 1304, and a gate terminal of the programming transistor 1302 is coupled to a programming word line (WLP); and a gate terminal of the reading transistor 1304 is coupled to a reading word line (WLR), and the other source/drain terminal of the reading transistor 1304 is coupled to a bit line (BL).

Figure 14:
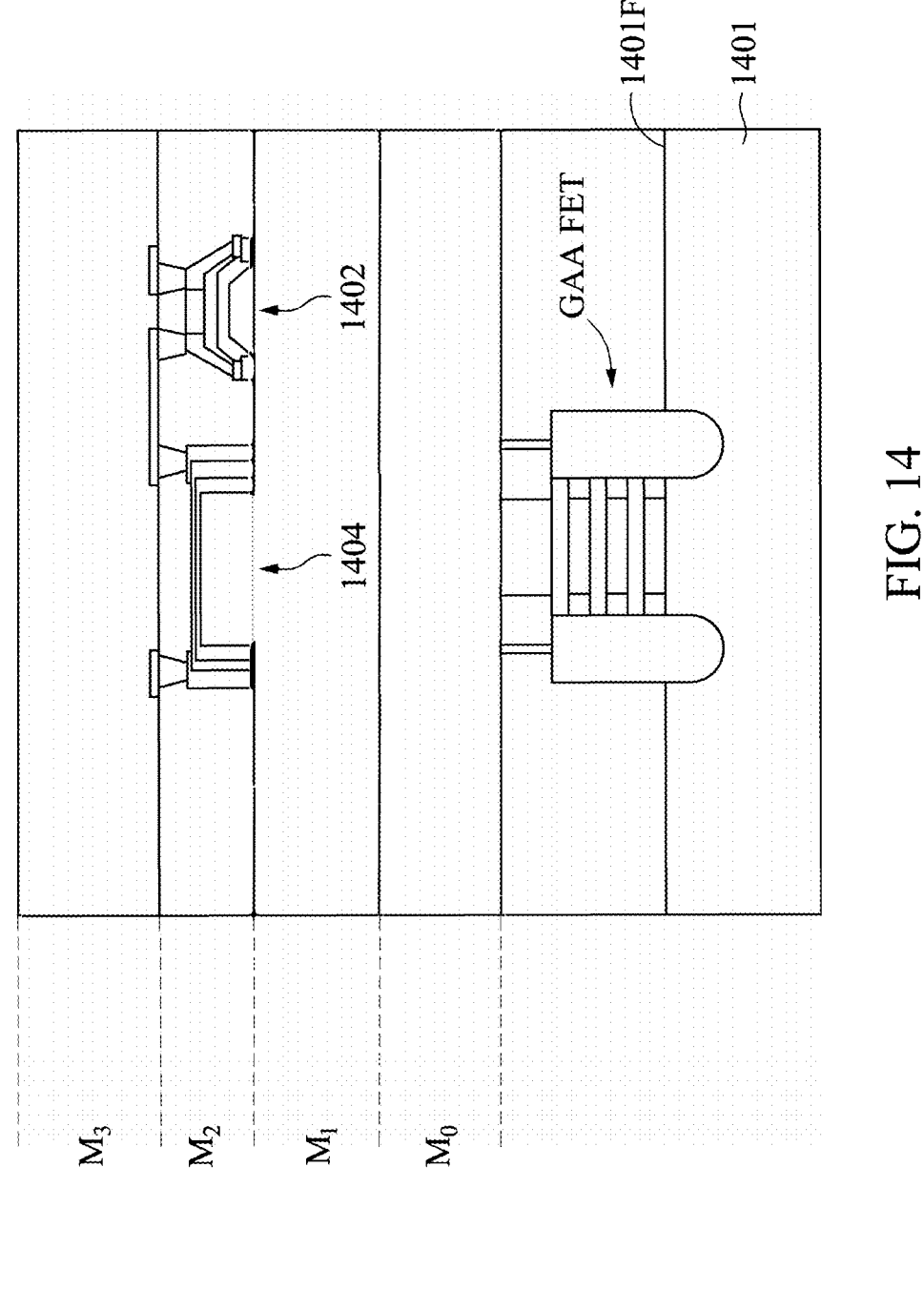
FIG. 14 illustrates a cross-sectional view of a semiconductor device including one of the anti-fuse memory cells shown in FIG. 13, in accordance with some embodiments.

FIG. 14 illustrate a cross-sectional view of a semiconductor devices 1400 including one of the anti-fuse memory cells 1300 that each consist of a programming transistor and a reading transistor (e.g., corresponding to 1302 and 1304 of FIG. 13, respectively), in accordance with some embodiments of the present disclosure. FIG. 14 is simplified to illustrate relatively spatial configurations of the above-discussed components. Thus, it should be understood that the semiconductor device 1400 can include one or more other features/structures, while remaining within the scope of the present disclosure.

As shown, the semiconductor devices 1400 includes a programming transistor 1402 and a reading transistor 1404 formed in a BEOL network over a substrate 1401. The programming transistor 1402 and a reading transistor 1404 may operatively function as an anti-fuse memory cell, e.g., 1300 of FIG. 13. In some embodiments, along a major surface 1401F of the substrate 1401, one or more transistors (e.g., GAA FETs) can be formed that operatively serve as control circuits (e.g., driver circuits, control logic circuits, decoders, etc.) for the anti-fuse memory cells of the semiconductor device 1300, while the programming transistor 1402 and the reading transistor 1404 are both formed in one or more of a plural number of metallization layers, e.g., M0, M1, M2, M3, M4, M5, etc., disposed over the substrate 1401. For example, the programming transistor 1402 and the reading transistor 1404 are both formed in the metallization layer M2. Further, in some embodiments, the programming transistor 1402 may be configured as a two-dimensional back-gate transistor and the reading transistor 1404 may be configured as a three-dimensional back-gate transistor.

Figure 15:
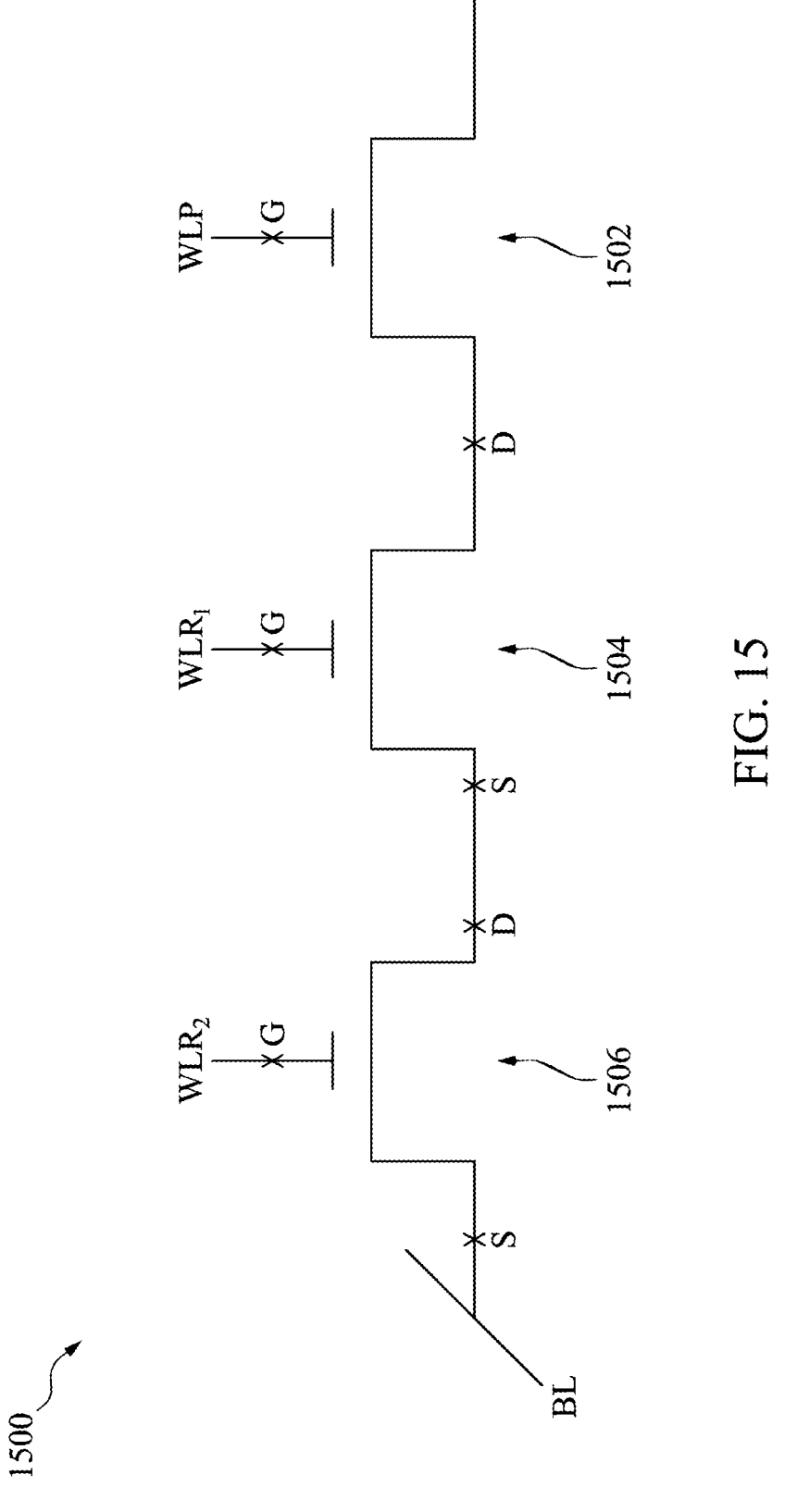
FIG. 15 illustrates an example schematic diagram of an anti-fuse memory cell of the semiconductor device of FIG. 1, in accordance with some embodiments.

FIG. 15 illustrates an example configuration of another anti-fuse memory cell 1500 that may include each of its components formed in the BEOL network, in accordance with some embodiments. The anti-fuse memory cell 1500 may be one of the memory cells 103 of FIG. 1. The anti-fuse memory cell 1500 may be another form of the OTP memory devices.

In the example of FIG. 15, the anti-fuse memory cell 1500 includes a programming transistor 1502, a first reading transistor 1504, and a second reading transistor 1506. The programming transistor 1502 and the reading transistors 1504-1506 are electrically coupled to one another in series. Further, one of the source/drain terminals of the programming transistor 1502 is floating (e.g., coupled to nothing), with the other source/drain terminal connected to one of the source/drain terminals of the first reading transistor 1504, and a gate terminal of the programming transistor 1502 is coupled to a programming word line (WLP); a gate terminal of the first reading transistor 1504 is coupled to a first reading word line (WLR₁), and the other source/drain terminal of the first reading transistor 1504 is coupled to one of the source/drain terminals of the second reading transistor 1506; a gate terminal of the second reading transistor 1506 is coupled to a second reading word line (WLR₂), and the other source/drain terminal of the second reading transistor 1506 is coupled to a bit line (BL).

Figure 16:
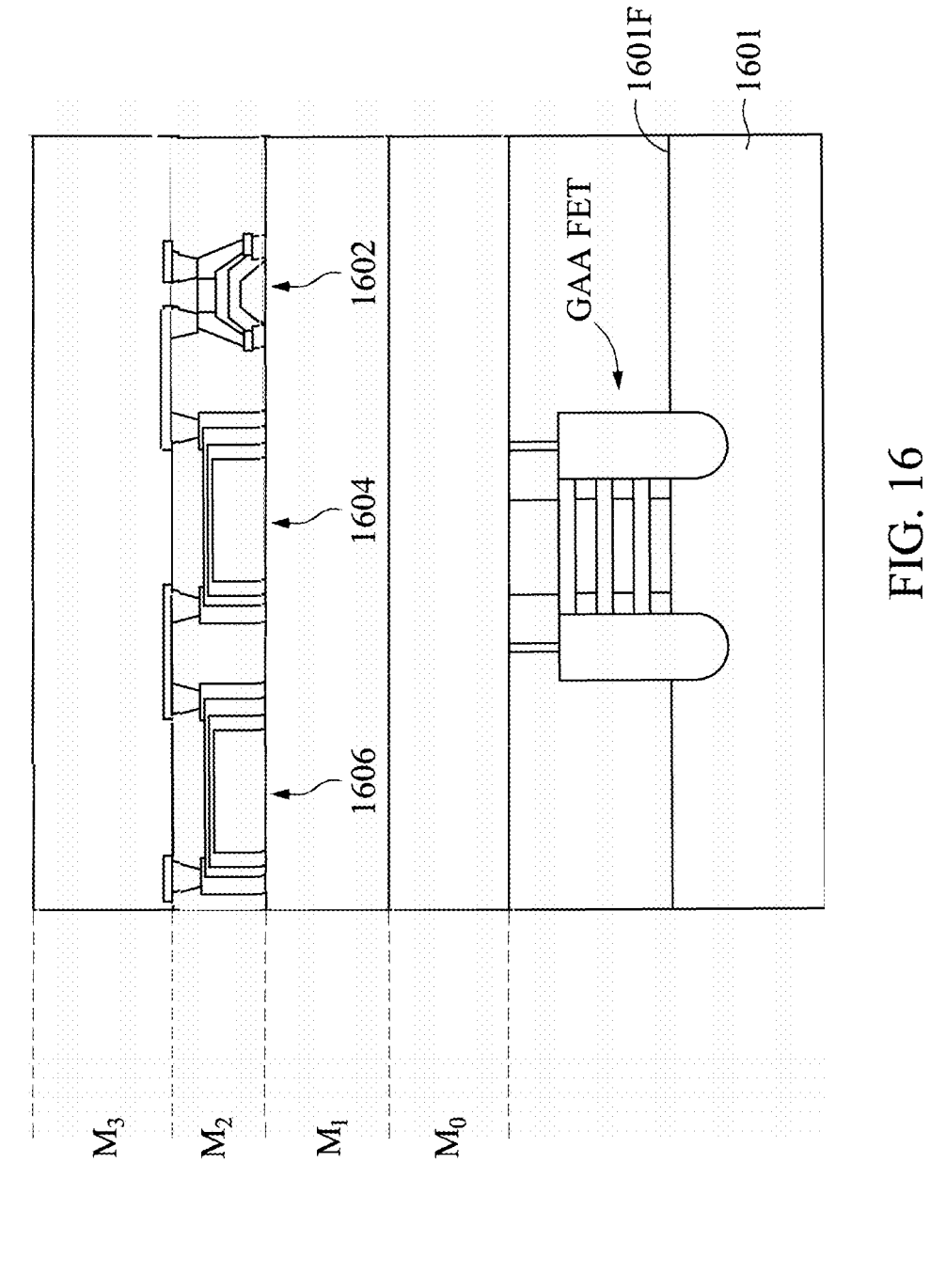
FIGS. 16 and 17 each illustrate a cross-sectional view of a semiconductor device including one of the anti-fuse memory cells shown in FIG. 15, in accordance with some embodiments.

FIG. 16 illustrate a cross-sectional view of a semiconductor devices 1600 including one of the anti-fuse memory cells 1500 that each consist of a programming transistor and two reading transistors (e.g., corresponding to 1502, 1504, and 1506 of FIG. 15, respectively), in accordance with some embodiments of the present disclosure. FIG. 16 is simplified to illustrate relatively spatial configurations of the above-discussed components. Thus, it should be understood that the semiconductor device 1600 can include one or more other features/structures, while remaining within the scope of the present disclosure.

As shown, the semiconductor devices 1600 includes a programming transistor 1602, a first reading transistor 1604, and a second reading transistor 1606 formed in a BEOL network over a substrate 1601. The programming transistor 1602 and reading transistors 1604-1606 may operatively function as an anti-fuse memory cell, e.g., 1500 of FIG. 15. In some embodiments, along a major surface 1601F of the substrate 1601, one or more transistors (e.g., GAA FETs) can be formed that operatively serve as control circuits (e.g., driver circuits, control logic circuits, decoders, etc.) for the anti-fuse memory cells of the semiconductor device 1600, while the programming transistor 1602 and the reading transistors 1604-1606 are all formed in one or more of a plural number of metallization layers, e.g., M0, M1, M2, M3, M4, M5, etc., disposed over the substrate 1601. For example, the programming transistor 1602 and the reading transistors 1604-1606 are all formed in the metallization layer M2. Further, in some embodiments, the programming transistor 1602 may be configured as a two-dimensional back-gate transistor, and the reading transistors 1604 and 1606 may each be configured as a three-dimensional back-gate transistor. Still further, the programming transistor 1602 and the reading transistors 1604-1606 may be laterally disposed next to one another, with the reading transistor 1604 interposed between the programming transistor 1602 and the reading transistor 1606.

Figure 17:
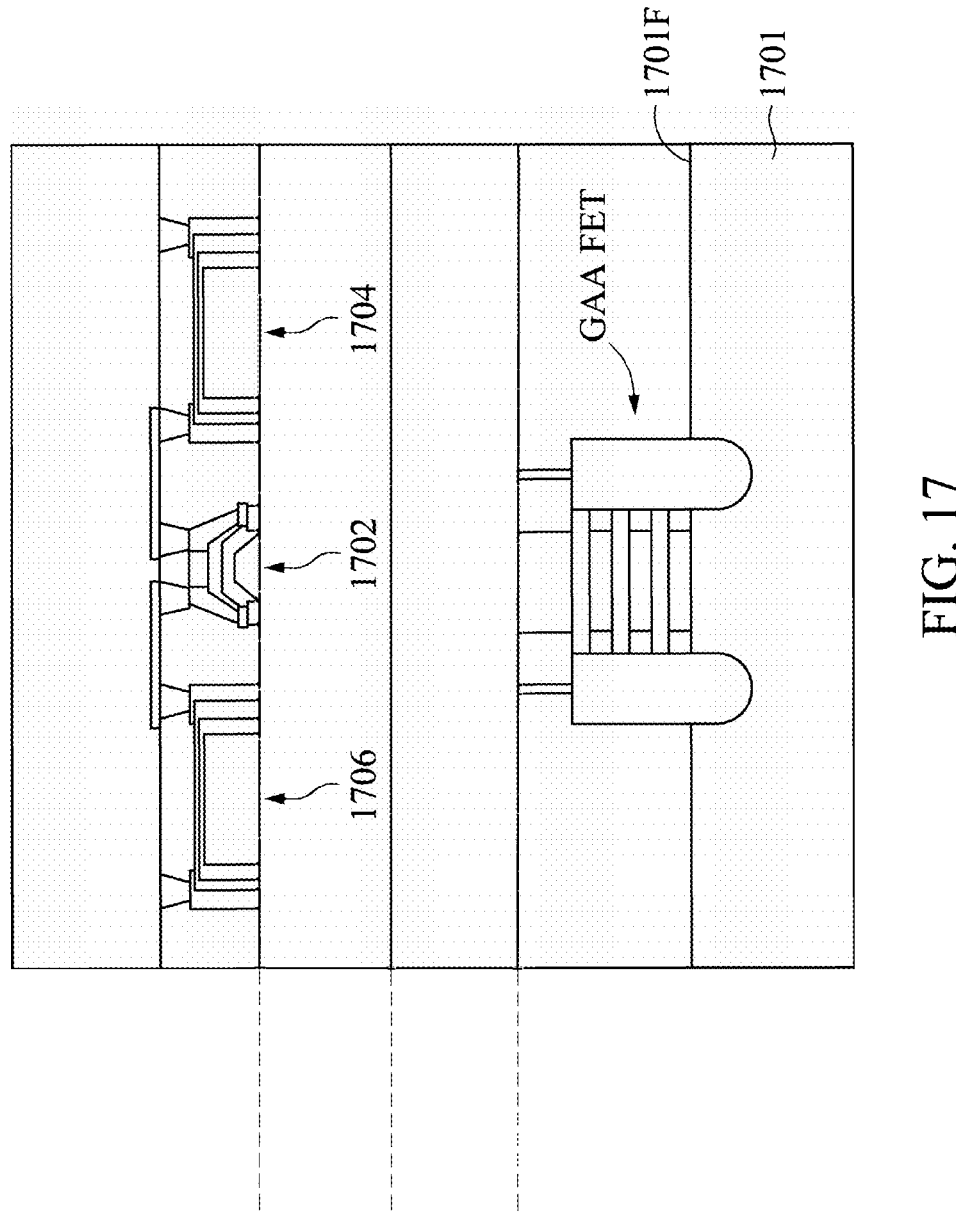

FIG. 17 illustrate a cross-sectional view of another semiconductor devices 1700 including one of the anti-fuse memory cells 1500 that each consist of a programming transistor and two reading transistors (e.g., corresponding to 1502, 1504, and 1506 of FIG. 15, respectively), in accordance with some embodiments of the present disclosure. FIG. 17 is simplified to illustrate relatively spatial configurations of the above-discussed components. Thus, it should be understood that the semiconductor device 1700 can include one or more other features/structures, while remaining within the scope of the present disclosure.

As shown, the semiconductor devices 1700 includes a programming transistor 1702, a first reading transistor 1704, and a second reading transistor 1706 formed in a BEOL network over a substrate 1701. The programming transistor 1702 and reading transistors 1704-1706 may operatively function as an anti-fuse memory cell, e.g., 1500 of FIG. 15. In some embodiments, along a major surface 1701F of the substrate 1701, one or more transistors (e.g., GAA FETs) can be formed that operatively serve as control circuits (e.g., driver circuits, control logic circuits, decoders, etc.) for the anti-fuse memory cells of the semiconductor device 1700, while the programming transistor 1702 and the reading transistors 1704-1706 are all formed in one or more of a plural number of metallization layers, e.g., M0, M1, M2, M3, M4, M5, etc., disposed over the substrate 1701. For example, the programming transistor 1702 and the reading transistors 1704-1706 are all formed in the metallization layer M2. Further, in some embodiments, the programming transistor 1702 may be configured as a two-dimensional back-gate transistor, and the reading transistors 1704 and 1706 may each be configured as a three-dimensional back-gate transistor. Still further, the programming transistor 1702 and the reading transistors 1704-1706 may be laterally disposed next to one another, with the programming transistor 1702 interposed between the reading transistor 1704 and the reading transistor 1706.

In one aspect of the present disclosure, a semiconductor device is disclosed. The semiconductor device includes a memory cell including a first transistor, a second transistor, and a resistor. Each of the first transistor and the second transistor is operatively coupled to the resistor in series. The second transistor is formed over one or more dielectric layers such that the second transistor is configured to accumulate heat and provide the accumulated heat to the resistor when the memory cell is being programmed.

In another aspect of the present disclosure, a semiconductor device is disclosed. The semiconductor device includes a plurality of one-time-programmable (OTP) memory cells formed as a memory array. Each of the plurality of OTP memory cells includes: a first transistor; a second transistor; and a metal resistor, wherein each of the first transistor and the second transistor is operatively coupled to the metal resistor in series.

In yet another aspect of the present disclosure, a method for forming memory devices is disclosed. The method includes forming a plurality of front-end-of-line (FEOL) transistors along a frontside surface of a substrate. The method includes forming a metal resistor in a first one of a plurality of metallization layers that are disposed over the frontside surface of the substrate. A first one of the FEOL transistors is electrically coupled to the metal resistor and a second one of the FEOL transistors is thermally coupled to the metal resistor.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a memory cell including a first transistor, a second transistor, and a resistor;
wherein each of the first transistor and the second transistor is operatively coupled to the resistor in series; and
wherein the second transistor is physically formed over one or more dielectric layers such that the second transistor is configured to operatively accumulate heat blocked by the one or more dielectric layers, and configured to provide the accumulated heat to the resistor when the memory cell is being programmed.

2. The semiconductor device of claim 1, wherein the first transistor and the second transistor are both formed in a front-end-of-line (FEOL) network over a semiconductor substrate, and the resistor is formed in a back-end-of-line (BEOL) network over the FEOL network.

3. The semiconductor device of claim 2, wherein the first transistor includes a plurality of first channel structures vertically spaced from one another and a pair of first source/drain structures, and the second transistor includes a plurality of second channel structures vertically spaced from one another and pair of second source/drain structures.

4. The semiconductor device of claim 3, wherein the pair of second source/drain structures are physically disposed above the semiconductor substrate through the one or more dielectric layers.

5. The semiconductor device of claim 3, wherein the second channel structures and the pair of second source/drain structures are physically disposed above the semiconductor substrate through the one or more dielectric layers.

6. The semiconductor device of claim 3, wherein the second transistor is disposed directly below the resistor, while the first transistor is disposed laterally next to the second transistor.

7. The semiconductor device of claim 1, wherein the first transistor is formed in a front-end-of-line (FEOL) network over a semiconductor substrate, the second transistor and the resistor are formed in a back-end-of-line (BEOL) network over the FEOL network.

8. The semiconductor device of claim 7, wherein the second transistor includes a two-dimensional channel formed of a semiconductive-behaving oxide material.

9. The semiconductor device of claim 1, wherein the first transistor, the second transistor, and the resistor are formed in a back-end-of-line (BEOL) network over a front-end-of-line (FEOL) network over a semiconductor substrate.

10. The semiconductor device of claim 9, wherein the first transistor includes a three-dimensional channel formed of a first semiconductive-behaving oxide material, the second transistor includes a two-dimensional channel formed of a second semiconductive-behaving oxide material.

11. The semiconductor device of claim 1, wherein the memory cell includes an electrical fuse configured to be programmed once.

12. A method for forming memory devices, comprising:
forming a plurality of front-end-of-line (FEOL) transistors along a frontside surface of a substrate;
forming one or more dielectric layers along the frontside surface of the substrate; and
forming a metal resistor in a first one of a plurality of metallization layers that are disposed over the frontside surface of the substrate;
wherein a first one of the FEOL transistors is electrically coupled to the metal resistor, and wherein a second one of the FEOL transistors is configured to accumulate heat with the one or more dielectric layer and thermally coupled to the metal resistor.

13. The method of claim 12, wherein the second FEOL transistor is formed over one or more dielectric layers that are interposed between the substrate and the second FEOL transistor such that the second FEOL transistor is configured to accumulate heat and provide the accumulated heat to the metal resistor.

14. A semiconductor device, comprising:
a memory cell including a first transistor, a second transistor, and a resistor;
wherein each of the first transistor and the second transistor is operatively coupled to the resistor in series; and
wherein the first transistor are the second transistor are both formed over a semiconductor substrate, and wherein one or more dielectric layers are disposed between the semiconductor substrate and only the second transistor, causing the second transistor to accumulate heat using the one or more dielectric layers.

15. The semiconductor device of claim 14, wherein the first transistor and the second transistor are both formed in a front-end-of-line (FEOL) network over the semiconductor substrate, and the resistor is formed in a back-end-of-line (BEOL) network over the FEOL network.

16. The semiconductor device of claim 14, wherein the second transistor is configured to provide the accumulated heat to the resistor when the memory cell is being programmed.

17. The semiconductor device of claim 14, wherein the first transistor includes a plurality of first channel structures vertically spaced from one another and a pair of first source/drain structures, and the second transistor includes a plurality of second channel structures vertically spaced from one another and pair of second source/drain structures.

18. The semiconductor device of claim 17, wherein at least one of the second channel structures or the pair of second source/drain structures are directly disposed above the one or more dielectric layers.

19. The semiconductor device of claim 14, wherein the second transistor is disposed directly below the resistor, while the first transistor is disposed laterally next to the second transistor.

20. The semiconductor device of claim 14, wherein the memory cell includes an electrical fuse configured to be programmed once.

21. The semiconductor device of claim 14, wherein the one or more dielectric layers each include silicon germanium oxide ($SiGeO_x$) and/or germanium oxide ($GeO_x$).

* * * * *